(12) United States Patent
Rügheimer et al.

(10) Patent No.: US 11,404,402 B2
(45) Date of Patent: Aug. 2, 2022

(54) COMPONENT ASSEMBLY AND METHOD FOR PRODUCING COMPONENTS

(71) Applicant: OSRAM OLED GmbH, Regensburg (DE)

(72) Inventors: Tilman Rügheimer, Regensburg (DE); Thomas Schwarz, Regensburg (DE); Lutz Höppel, Alteglofsheim (DE); Andreas Plößl, Regensburg (DE); Alexander F. Pfeuffer, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 164 days.

(21) Appl. No.: 16/759,718

(22) PCT Filed: Nov. 6, 2018

(86) PCT No.: PCT/EP2018/080249
§ 371 (c)(1),
(2) Date: Apr. 27, 2020

(87) PCT Pub. No.: WO2019/091948
PCT Pub. Date: May 16, 2019

(65) Prior Publication Data
US 2021/0183834 A1    Jun. 17, 2021

(30) Foreign Application Priority Data
Nov. 10, 2017    (DE) .................. 10 2017 126 338.1

(51) Int. Cl.
*H01L 25/16*    (2006.01)
*H01L 25/075*    (2006.01)
(Continued)

(52) U.S. Cl.
CPC ........ *H01L 25/167* (2013.01); *G01R 31/2635* (2013.01); *H01L 25/0753* (2013.01);
(Continued)

(58) Field of Classification Search
CPC ... H01L 25/167; H01L 25/0753; H01L 33/08; H01L 33/52; H01L 33/62; H01L 2224/18; H01L 33/0095; G01R 31/2635
See application file for complete search history.

(56) References Cited

U.S. PATENT DOCUMENTS 10,468,391 B2 * 11/2019 Cok .................. H01L 25/0753
10,475,876 B2 * 11/2019 Bower .............. H01L 27/3288
(Continued)

FOREIGN PATENT DOCUMENTS

DE    10 2016 103 328 A1    8/2017

OTHER PUBLICATIONS

International Search Report issued in corresponding International Patent Application No. PCT/EP2018/080249 dated Jan. 24, 2019, along with an English translation.
(Continued)

*Primary Examiner* — Victor A Mandala
(74) *Attorney, Agent, or Firm* — Hauptman Ham, LLP

(57) ABSTRACT

A component assembly includes an intermediate carrier, a plurality of components and a plurality of anchoring elements. The components have at least two electrical devices and an insulating layer. At least one of the electrical devices is an optoelectronic semiconductor chip. The insulating layer is between the electrical devices of a same component. The at least two electrical devices of the same component are arranged next to one another and enclosed laterally by the insulating layer. The at least two electrical devices and the insulating layer of the same component are integral parts of a self-supporting and mechanically stable unit. The self-
(Continued)

Figure 1A:
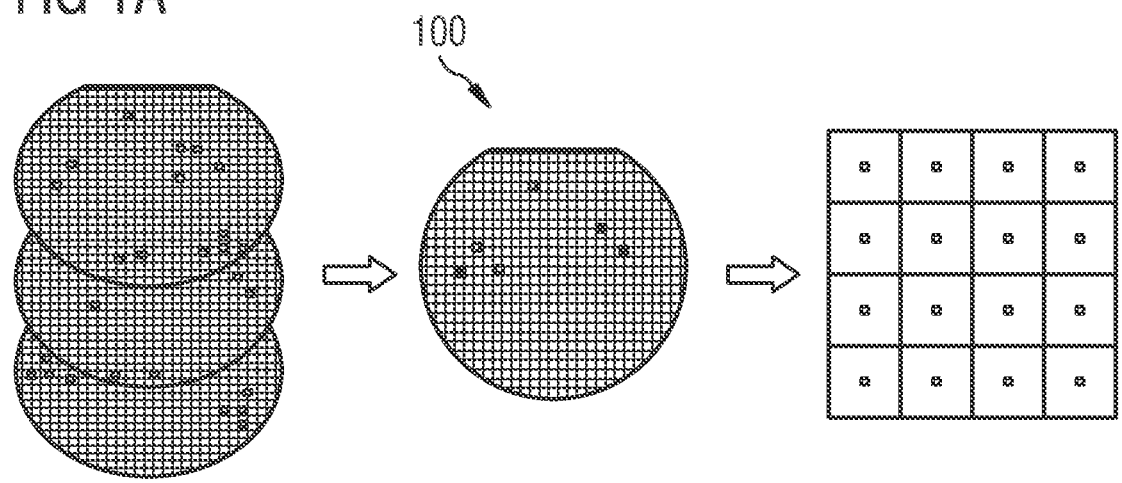

supporting and mechanically stable unit and the anchoring elements fix the positions of the components on the intermediate carrier. The components that are self-supporting and mechanically stable units are detachable from the intermediate carrier, and the anchoring elements release the components under mechanical load when the latter are removed.

20 Claims, 27 Drawing Sheets

(51) Int. Cl.
    *H01L 33/08*     (2010.01)
    *H01L 33/52*     (2010.01)
    *H01L 33/62*     (2010.01)
    *G01R 31/26*     (2020.01)

(52) U.S. Cl.
    CPC .............. *H01L 33/08* (2013.01); *H01L 33/52* (2013.01); *H01L 33/62* (2013.01)

(56) References Cited

U.S. PATENT DOCUMENTS

| | | | |
|---|---|---|---|
| 2005/0233504 A1 | 10/2005 | Doi et al. | |
| 2006/0063309 A1* | 3/2006 | Sugiyama | H01L 27/1266 438/30 |
| 2012/0314388 A1* | 12/2012 | Bower | H05K 3/20 156/219 |
| 2013/0126098 A1 | 5/2013 | Bibl et al. | |
| 2013/0128585 A1 | 5/2013 | Bibl et al. | |
| 2014/0061687 A1 | 3/2014 | Hu et al. | |
| 2014/0084482 A1 | 3/2014 | Hu et al. | |
| 2014/0340900 A1 | 11/2014 | Bathurst et al. | |
| 2014/0353710 A1 | 12/2014 | Zitzlsperger et al. | |
| 2015/0200138 A1* | 7/2015 | Schlereth | H01L 33/0095 438/15 |
| 2015/0349137 A1 | 12/2015 | Higashi et al. | |
| 2015/0372187 A1* | 12/2015 | Bower | H01L 25/50 438/110 |
| 2016/0133496 A1 | 5/2016 | Lambert et al. | |
| 2016/0155891 A1* | 6/2016 | Moosburger | H01L 27/15 438/27 |
| 2016/0268491 A1 | 9/2016 | Wu et al. | |
| 2017/0250167 A1* | 8/2017 | Bower | H01L 21/6835 |
| 2017/0294479 A1 | 10/2017 | Cha et al. | |
| 2018/0084614 A1* | 3/2018 | Bower | H05B 47/11 |
| 2018/0211945 A1* | 7/2018 | Cok | H01L 33/0093 |
| 2019/0051552 A1* | 2/2019 | Bower | H01L 33/0095 |
| 2019/0237590 A1* | 8/2019 | Becker | H01L 25/167 |
| 2019/0237593 A1* | 8/2019 | Becker | H01L 31/0203 |
| 2019/0326149 A1* | 10/2019 | Bower | H01L 33/62 |
| 2020/0083200 A1* | 3/2020 | Yip | H01L 21/00 |

OTHER PUBLICATIONS

Written Opinion issued in corresponding International Patent Application No. PCT/EP2018/080249 dated Jan. 24, 2019.
Search Report issued in corresponding German Patent Application No. 10 2017 126 338.1 dated Jul. 31, 2018.
Datasheet SMD EAST0505RGBA0, Copyright 2010, Everlight Americas Inc. Release Date: Jun. 11, 2015, Issue No. DSE0013279 Rev.2, 12 pages.
Kingbright, Spec No. DSAO2565, Rev No. V.1B, date: Aug. 31, 2015, 6 pages.
Multi CHIPLED Datasheet Version 1.0 LTRB RASF, Jan. 26, 2015 OSRAM Opto Semiconductors, 23 pages.
Prevatte et al., "Miniature Heterogeneous Fan-Out Packages for High-Performance, Large-Format Systems", 2017 IEEE 67th Electronic Components and Technology Conference (ECTC), Orlando, FL, 2017, pp. 1098-1106., 9 pages.

* cited by examiner

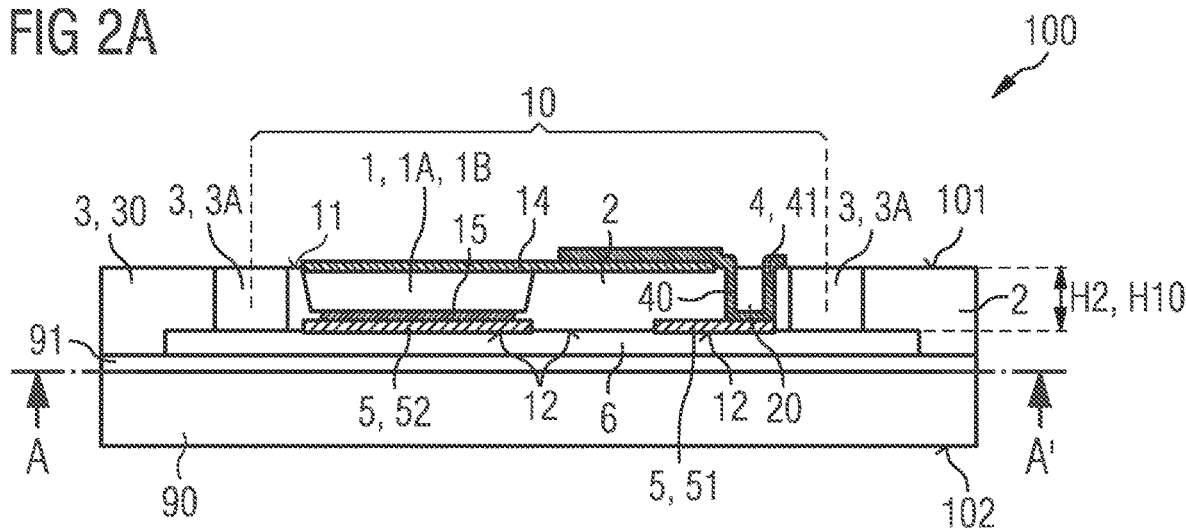
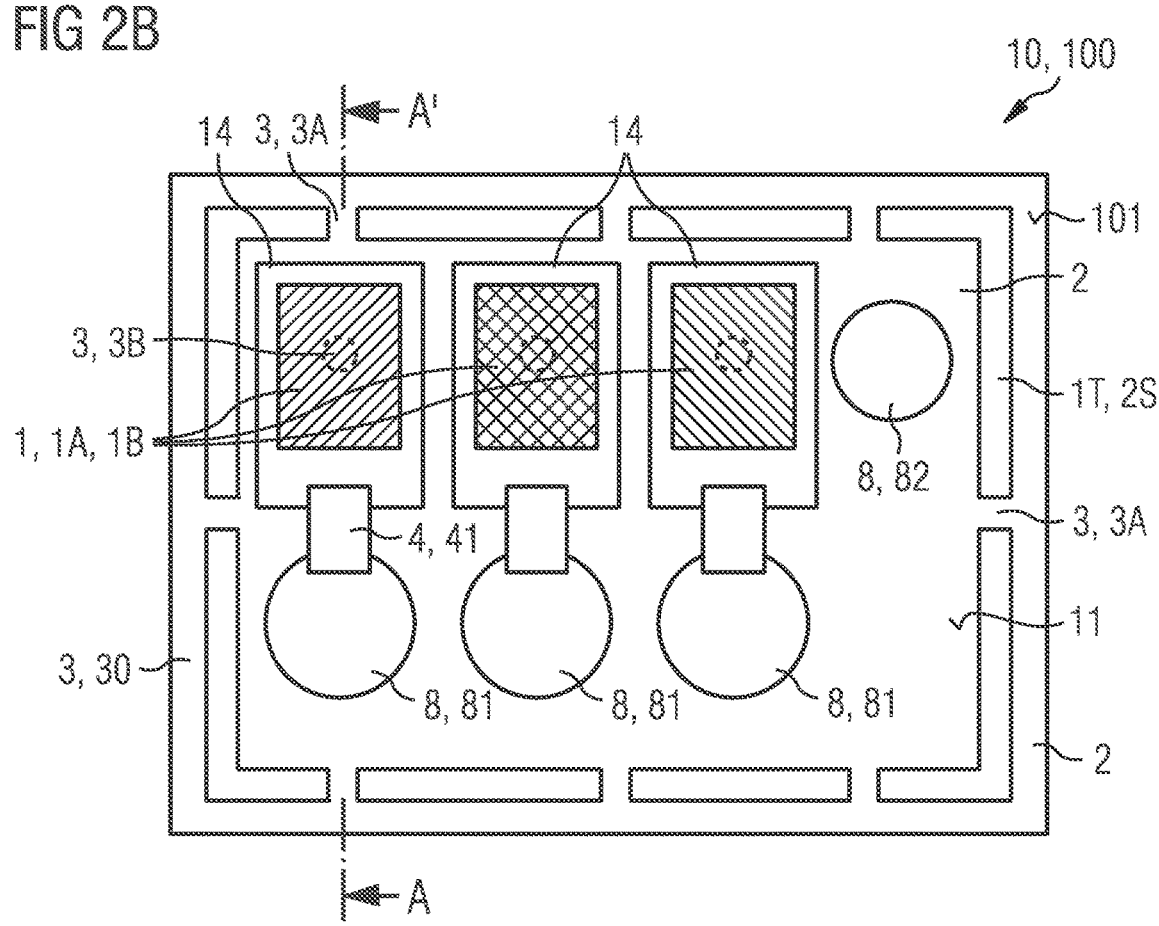

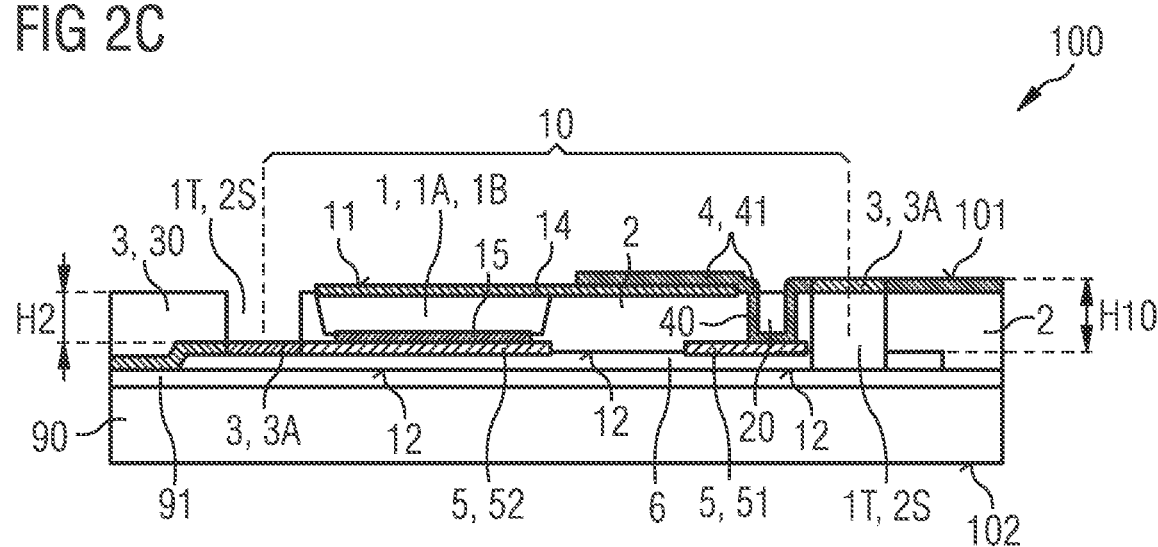
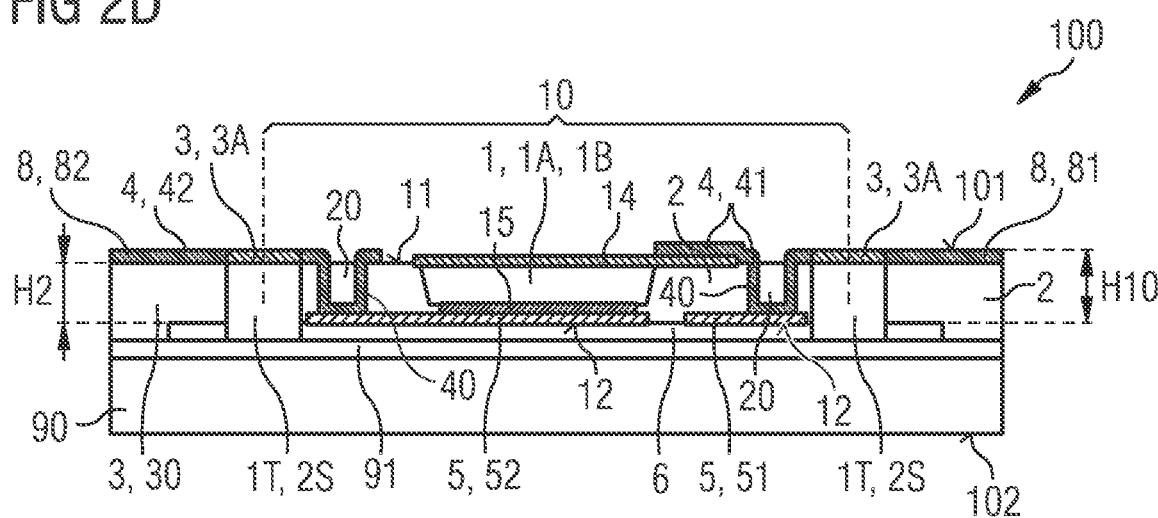

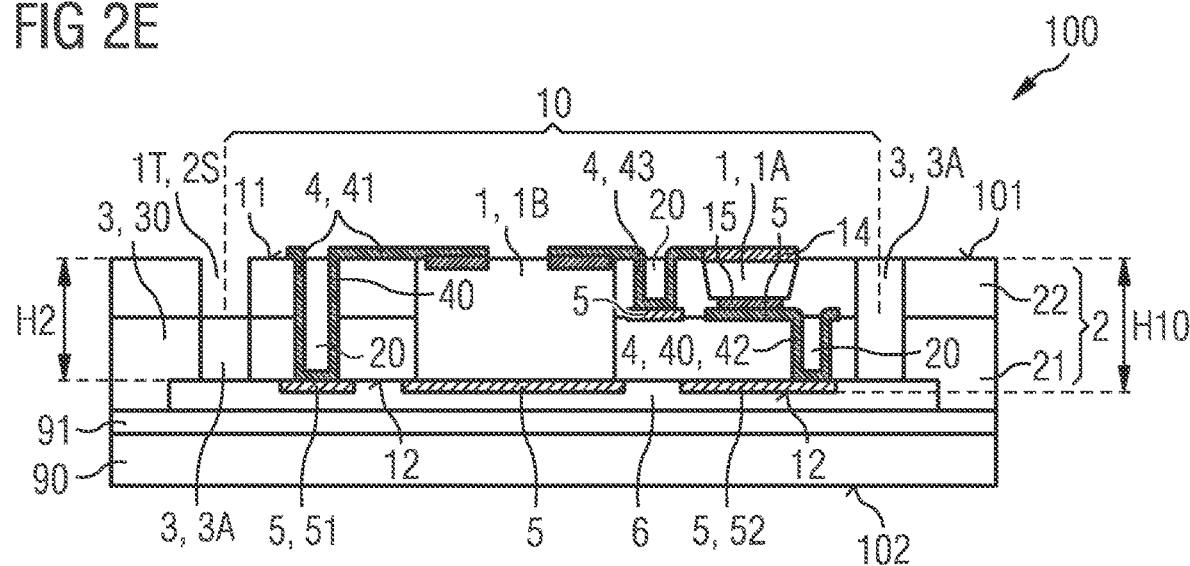
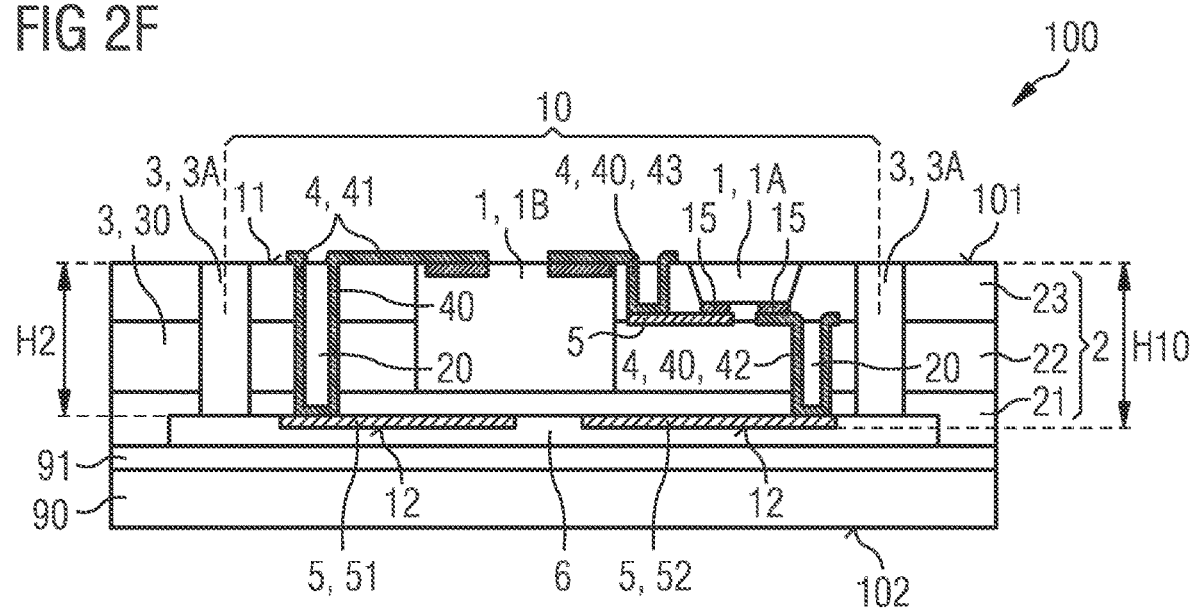

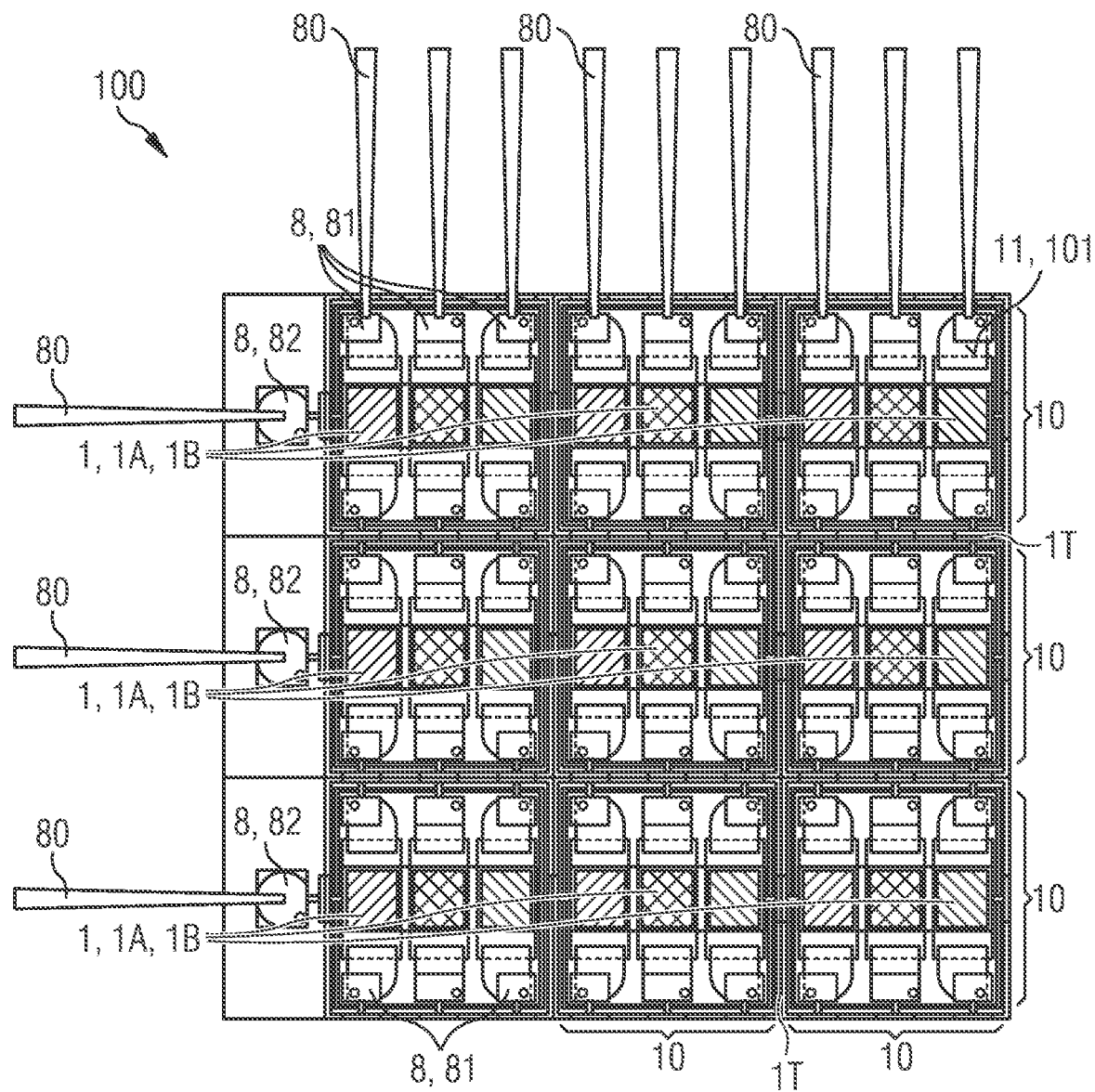

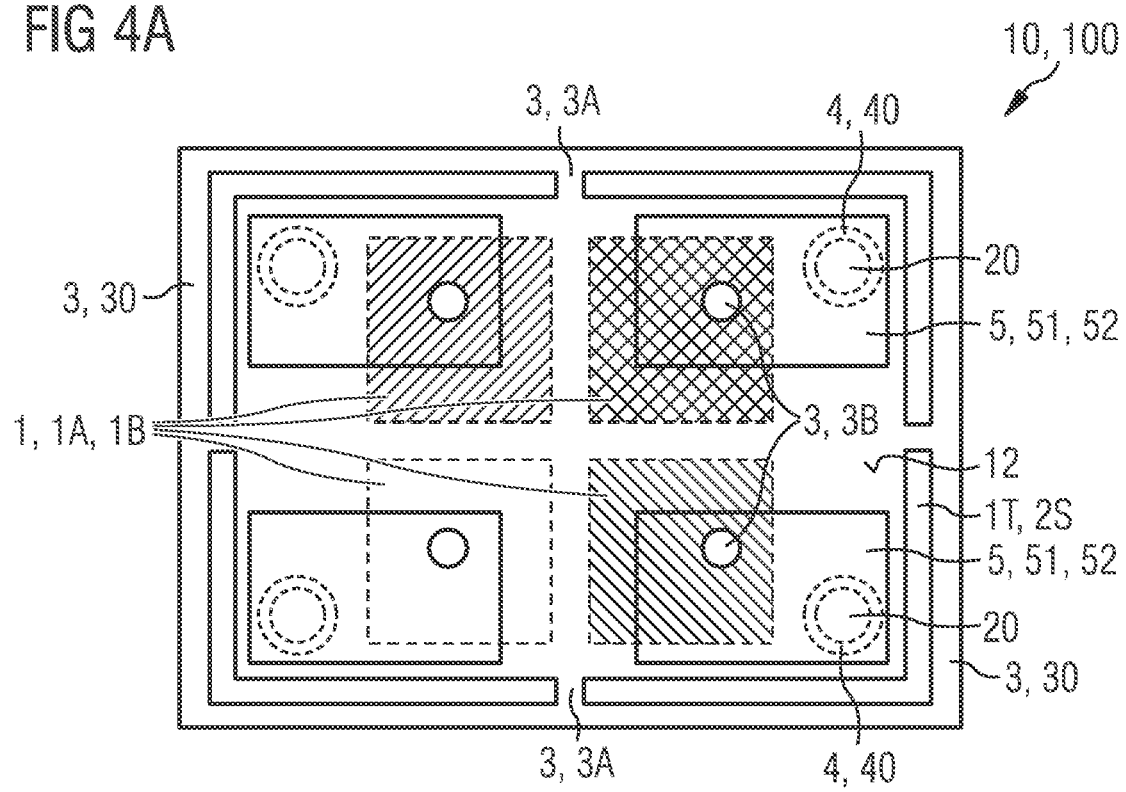
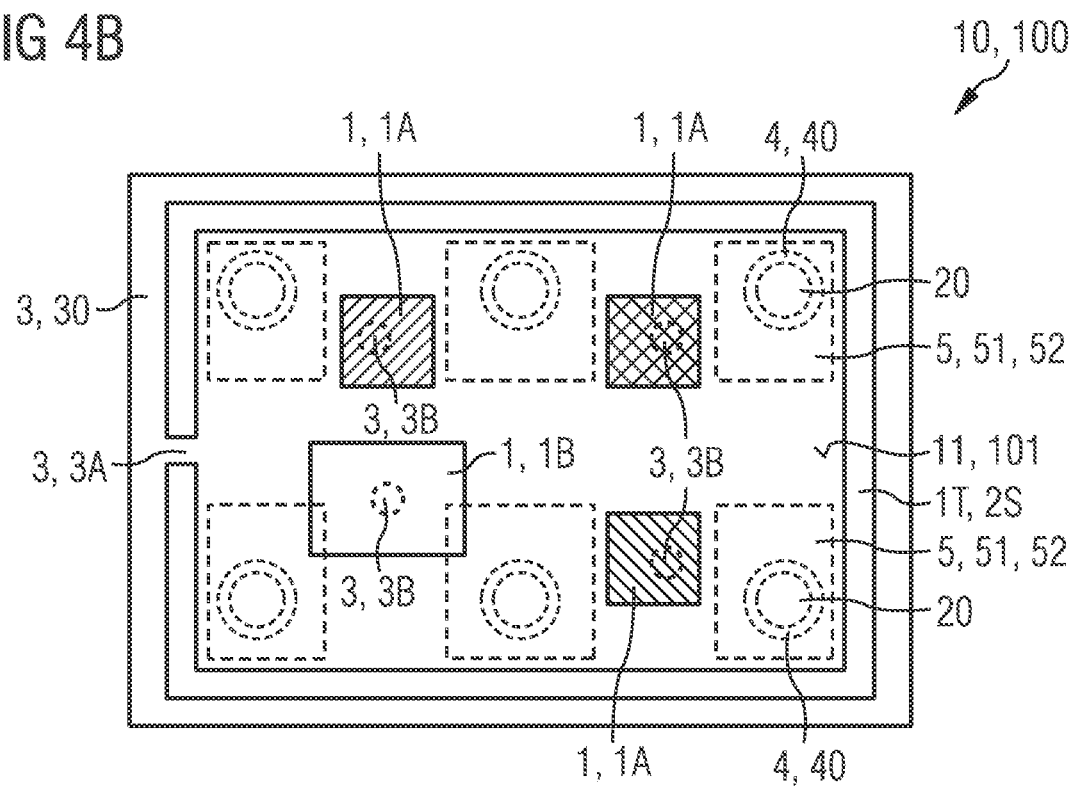

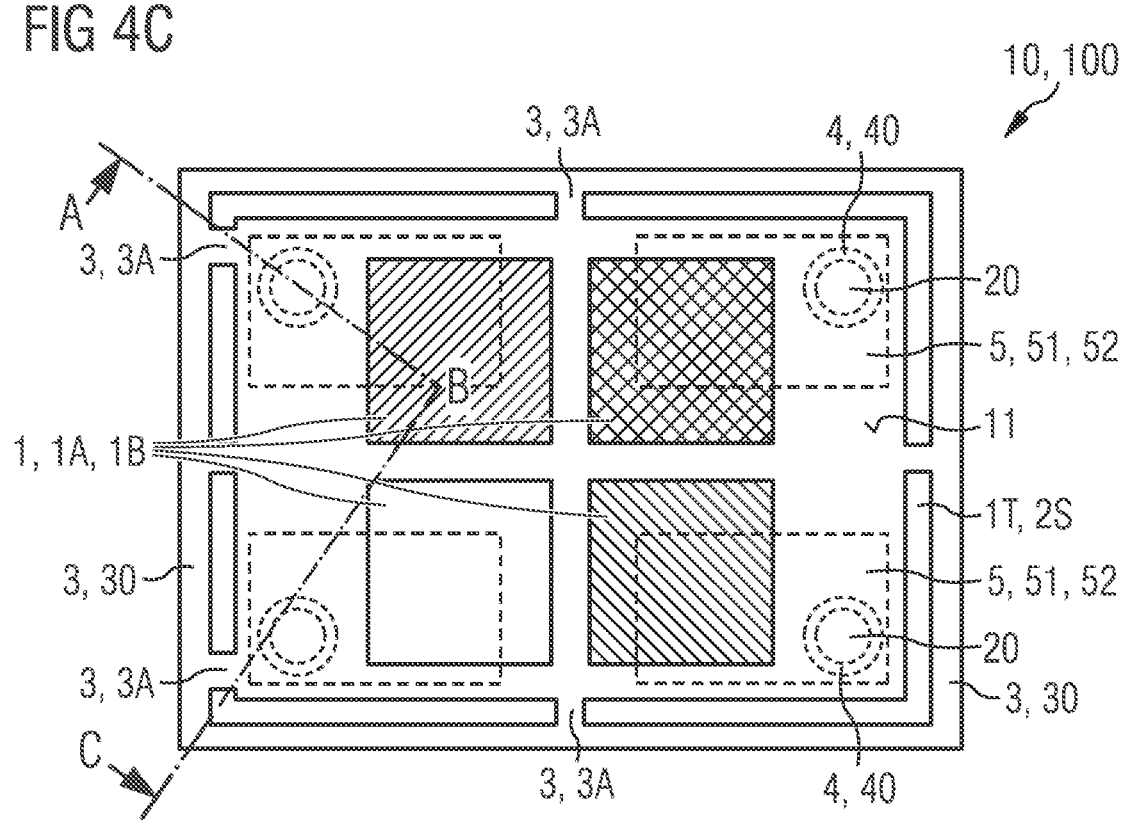

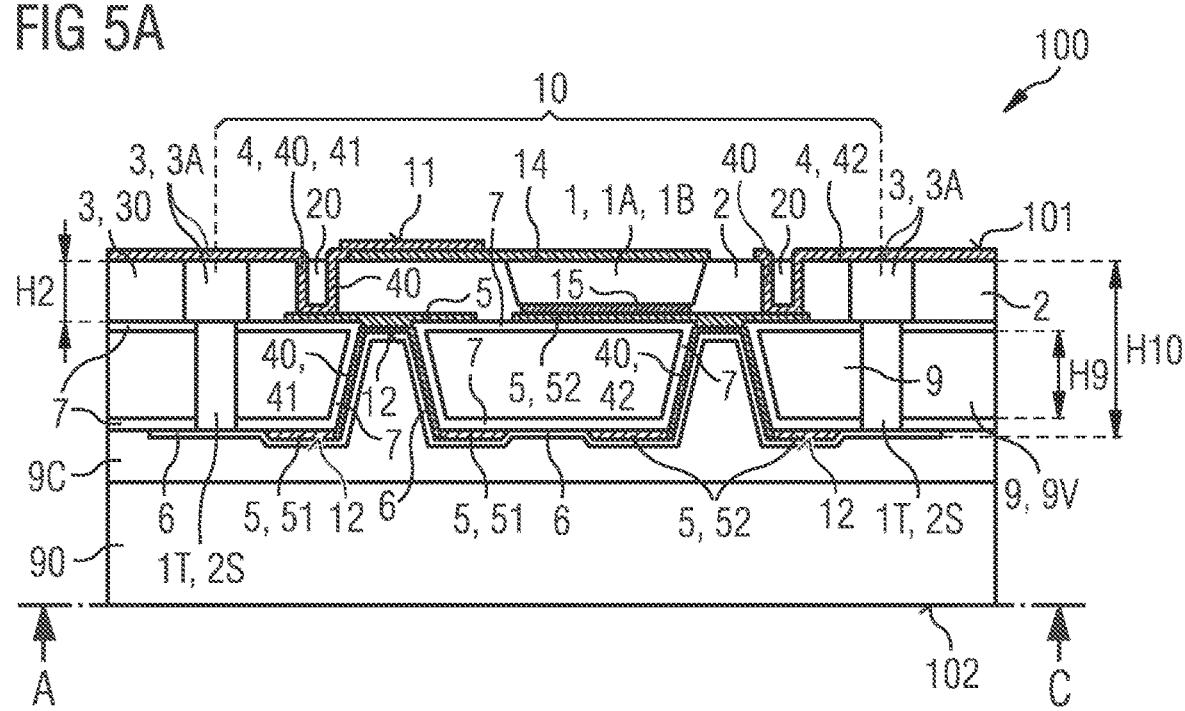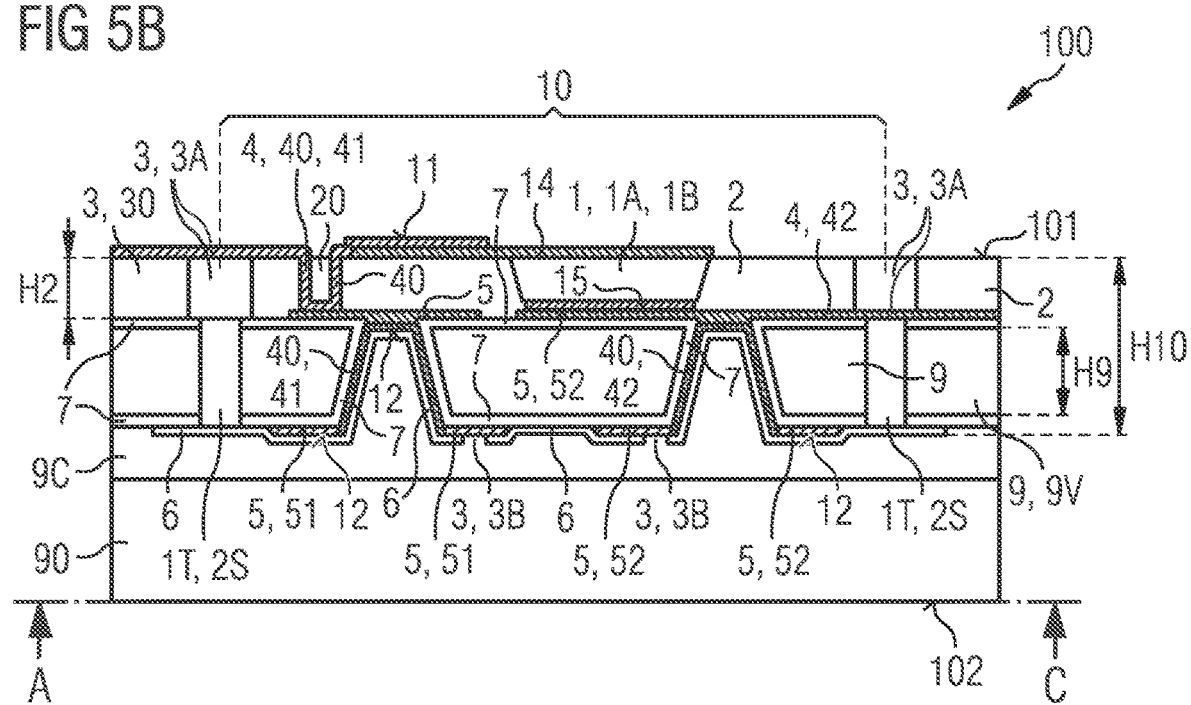

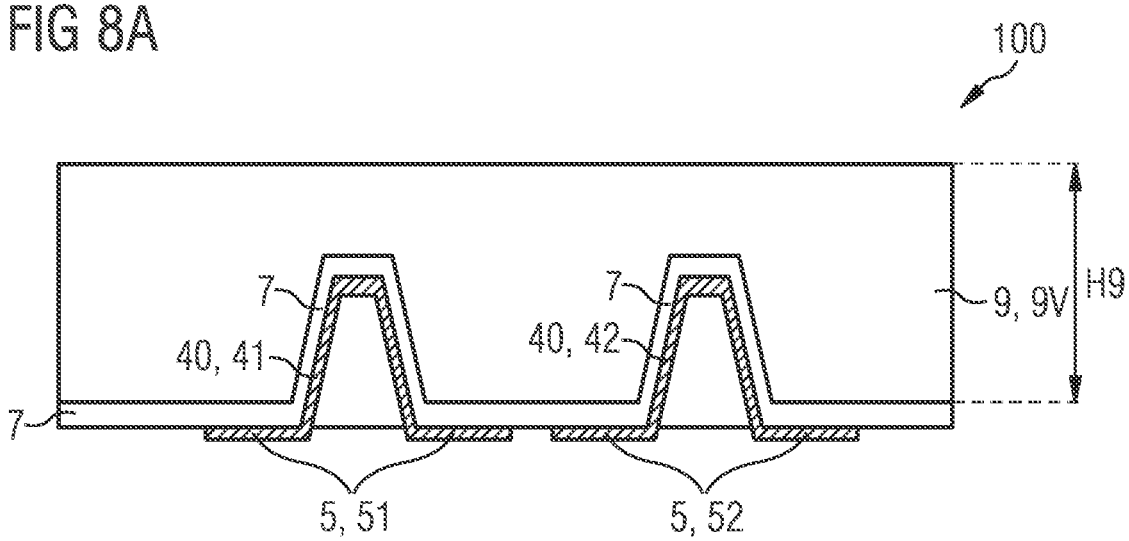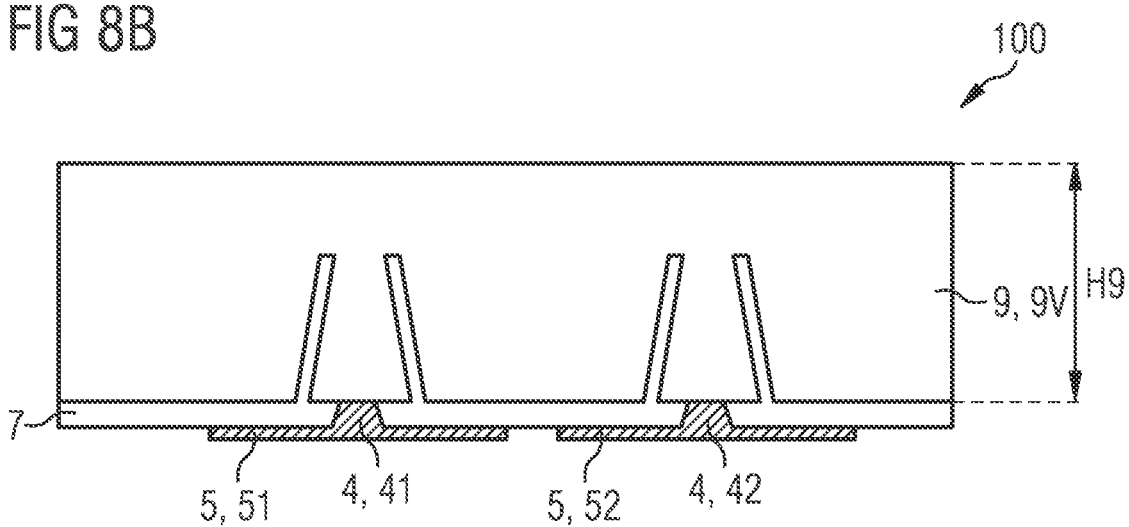

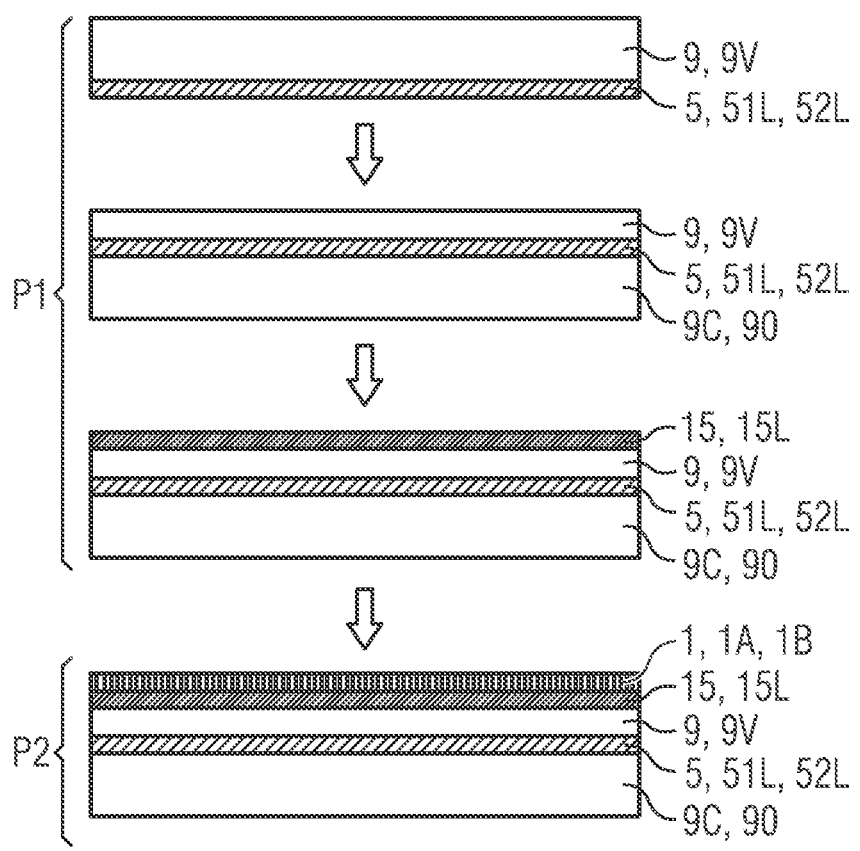

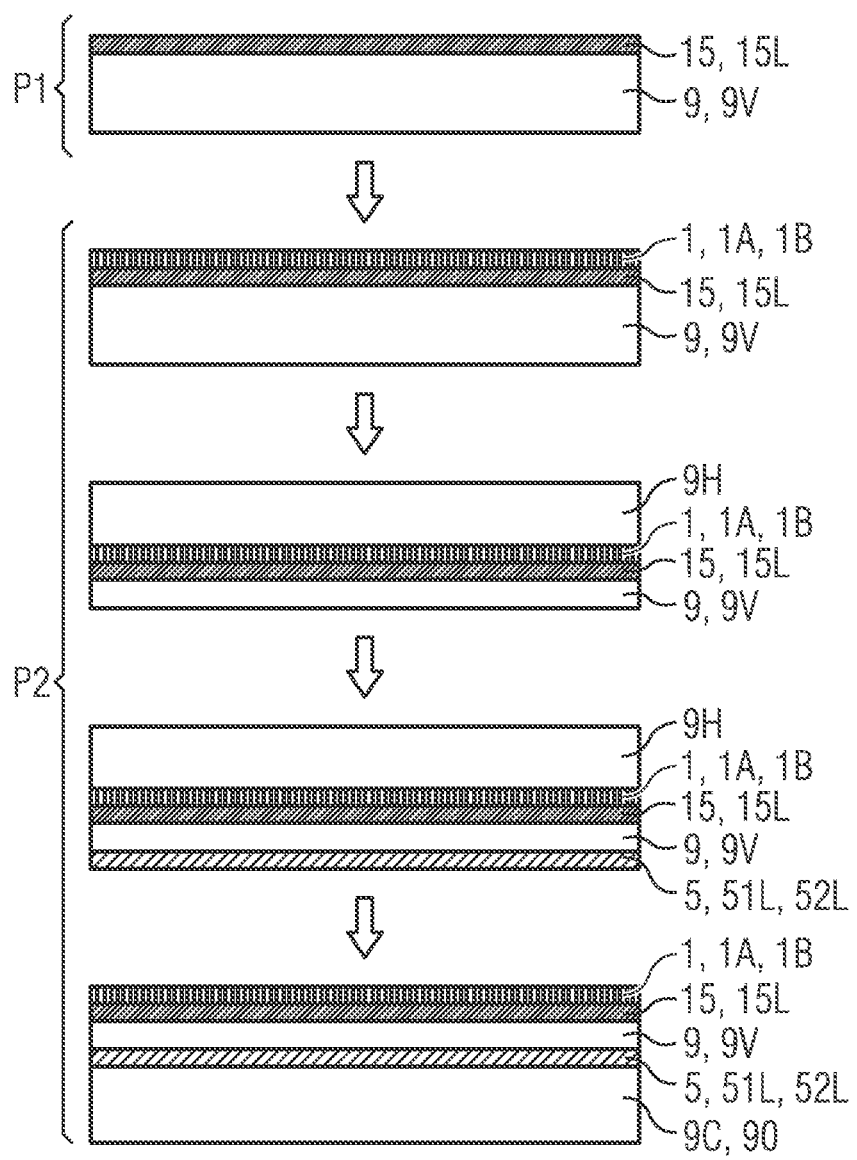

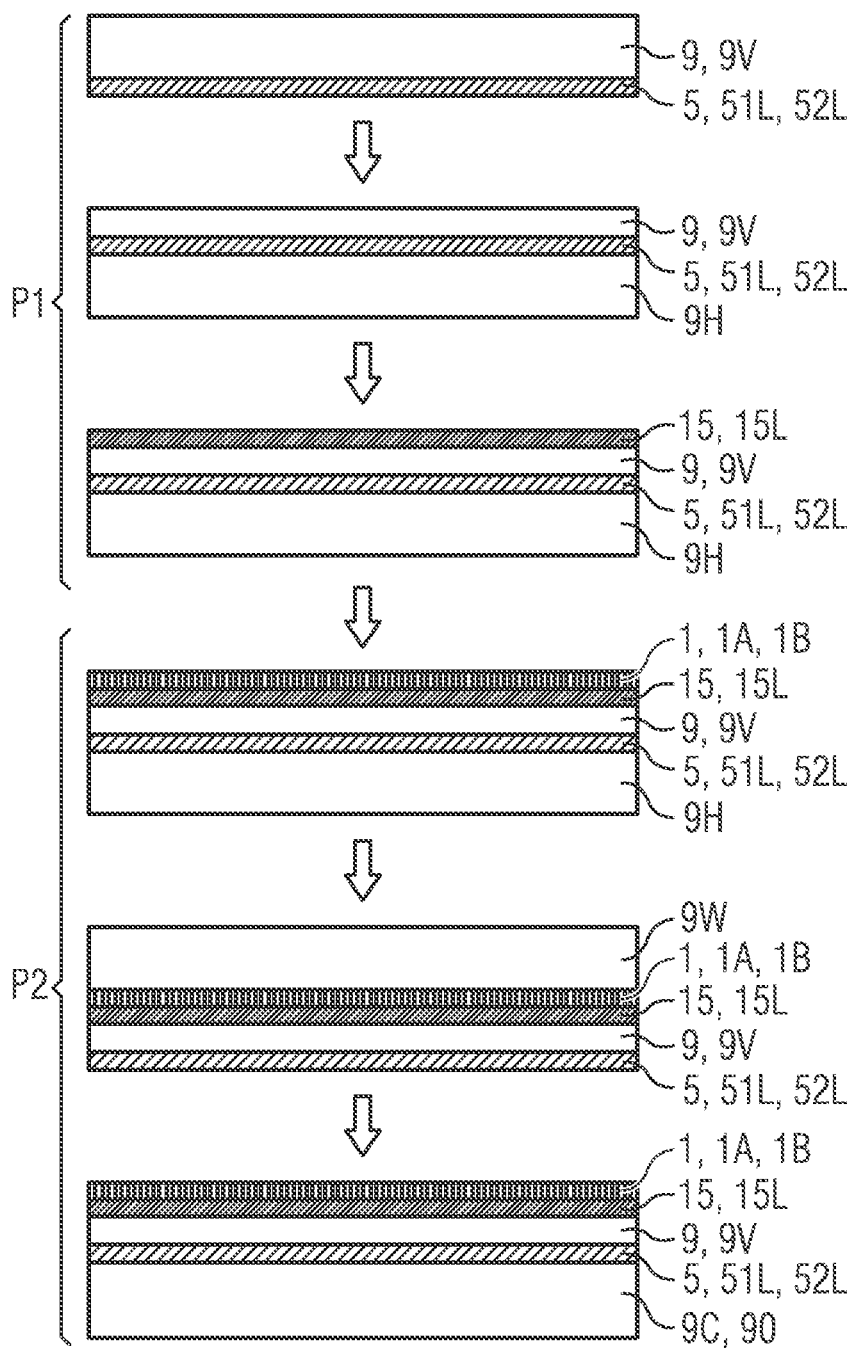

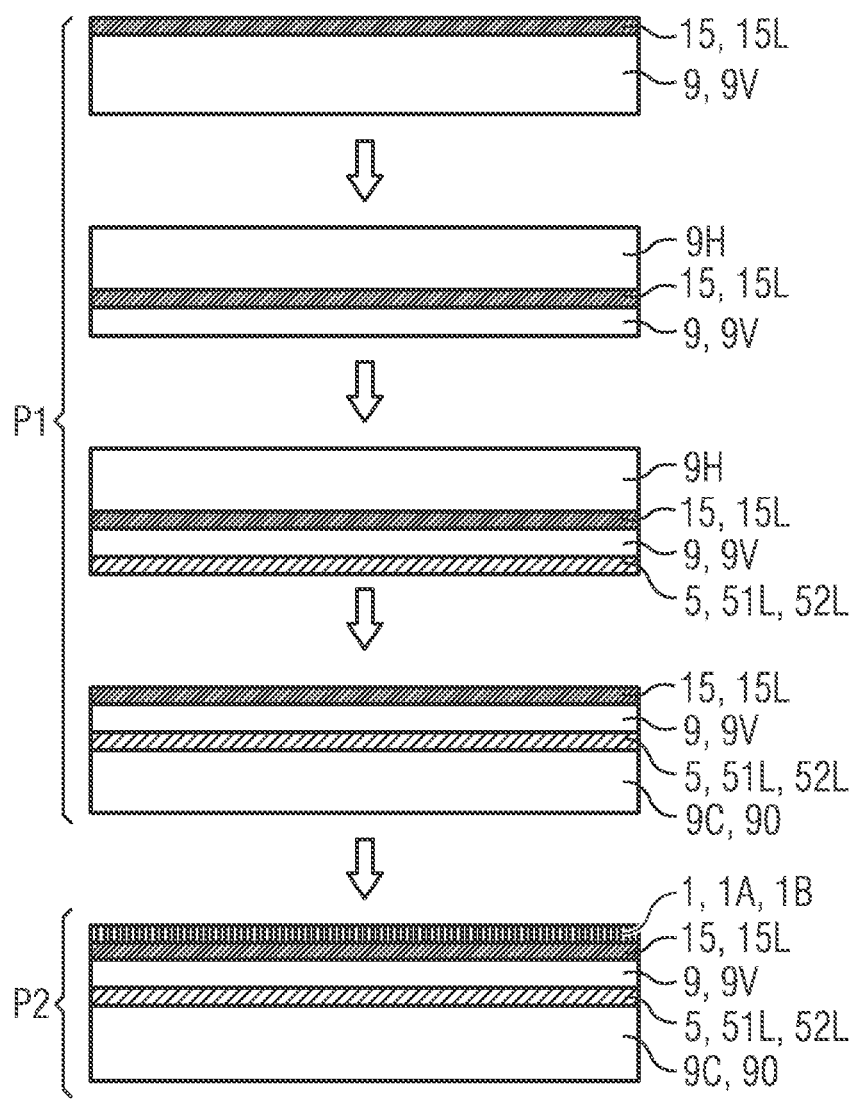

COMPONENT ASSEMBLY AND METHOD FOR PRODUCING COMPONENTS

CROSS REFERENCE TO RELATED APPLICATION

This application is a National Stage of International Application No. PCT/EP2018/080249, filed on Nov. 6, 2018, which designates the United States and was published in Europe, and which claims priority to German Patent Application No. 10 2017 126 338.1, filed on Nov. 10, 2017, in the German Patent Office. Both of the aforementioned applications are hereby incorporated by reference in their entireties.

A method for producing a plurality of components is specified. Furthermore, a component or a component assembly comprising a plurality of components arranged in particular on a common intermediate carrier is specified.

By mounting conventional LED components on large illuminated areas, individual LED chips of the basic colors, which are pre-sorted in terms of wavelength or brightness, are installed in a serial process in a package for later installation. Thus, the subsequent montage of the LED chips in the package can be carried out serially. Although the serial placement is particularly flexible, it is not cost-effective for applications with a large number of LED chips or for the montage on a large illuminated area. The testing of LED chips before mounting is also time-consuming and cost-intensive.

One object is to specify components that can be quickly and easily mounted on an illuminated surface. Furthermore, a reliable and cost-efficient method for producing and/or testing a plurality of components, especially of printable and/or surface-mountable components, is specified.

According to at least one embodiment of a method for producing a plurality of printable components, a plurality of electrical devices are arranged on a common intermediate carrier. The electrical devices can be applied onto the intermediate carrier, or they can first be applied onto a carrier or a carrier assembly, wherein the carrier or the carrier assembly is fixed to the intermediate carrier in a subsequent method step. The electrical devices can be arranged on the intermediate carrier in such a way that they form a plurality of groups of the components. Each component can have at least two or more electrical devices, wherein at least one of the electrical devices of the component is an optoelectronic semiconductor chip. The component can have exactly three or four optoelectronic semiconductor chips, each of which emits light in particular of different peak wavelengths during operation, so that the component can be formed as a pixel for reproducing any desired color tone during operation. The component may have further electrical devices, such as one or several integrated circuits in particular for driving the optoelectronic semiconductor chips, sensors and/or electrical resistors.

According to at least one embodiment of the method, an insulating layer is formed between the electrical devices of the same component, wherein the at least two electrical devices or all electrical devices of the same component are arranged next to one another and in each case are laterally enclosed by the insulating layer. The electrical devices and the insulating layer of the same component can form integral parts of a self-supporting and mechanically stable unit. The insulating layer can be of single-layer or multi-layer design. For example, the insulating layer is formed from an oxide material or a nitride material. It is possible for the insulating layer to contain molding materials such as silicone or synthetic resins or to be free of such materials.

A lateral direction is understood to mean a direction which is in particular parallel to a main extension surface of the intermediate carrier, the carrier and/or of the component. For example, the lateral direction runs parallel to a rear side of the intermediate carrier, the carrier and/or of the component facing away from the electrical devices. A vertical direction is understood to mean a direction which is directed in particular perpendicular to the main extension surface of the intermediate carrier, of the carrier and/or of the component. For instance, the vertical direction and the lateral direction are orthogonal to each other.

According to at least one embodiment of the method, a plurality of anchoring elements is formed which fix or at least temporarily fix the position of the components on the intermediate carrier. In particular, the components on the intermediate carrier are formed in such a way that they can be removed from the intermediate carrier individually or in groups. When removing the components, the anchoring elements are preferably formed in such a way that they release the components under mechanical load, so that the components are formed as self-supporting and mechanically stable units that can be detached or removed from the intermediate carrier. Preferably, the anchoring elements are formed so that they can be broken or detached under mechanical load.

The components on the intermediate carrier can be laterally spaced from each other by separation trenches. The anchoring elements can be formed as anchoring tethers which can bridge the separation trenches in places. The insulating layers of adjacent components can be connected to each other via the anchoring tethers. It is possible that the insulating layer and the anchoring tethers or at least parts of the anchoring tethers are made of the same material or of different materials. The anchoring tethers may be made of a transparent electrically conductive material. The insulating layers of different components may be form in a contiguous manner, wherein the anchoring tethers are formed by structuring the insulating layers in the regions between the adjacent components. In lateral directions, the anchoring tethers may protrude laterally beyond the components. The anchoring tethers can be mechanically connected to an anchoring frame and/or connect adjacent components.

The anchoring elements can be formed as anchoring posts which are arranged in particular in vertical direction between the components and the intermediate carrier. In a plan view of the intermediate carrier, the components may completely cover the anchoring posts belonging to them. The anchoring posts may adjoin, for instance directly adjoin a rear side of the associated component facing away from the electrical devices.

The anchoring elements, for instance in the form of anchoring tethers or anchoring posts, may be electrically insulating or electrically conductive. It is possible for a component to have electrically insulating and/or electrically conductive anchoring elements. For example, the component comprises a plurality of anchoring elements, wherein some anchoring tethers and/or anchoring posts are formed to be electrically insulating and the other anchoring tethers and/or anchoring posts are formed to be electrically conductive.

According to at least one embodiment of the method, the components are provided as a component assembly on the intermediate carrier. In particular via the anchoring elements, the components are mechanically connected to each other and/or to the intermediate carrier. It is possible that a removable sacrificial layer is arranged in the vertical direction between the intermediate carrier and the components. If the sacrificial layer is removed, a cavity may form between the intermediate carrier and the components. In the lateral directions there may be further cavities which are formed, for example, as separation trenches between adjacent components. The cavities, for example in the form of separation trenches between the adjacent components, and the cavity, which is formed between the intermediate carrier and the components for instance by removing the sacrificial layer, may directly adjoin each other.

In particular, the components are directly or indirectly mechanically connected to the intermediate carrier only via the anchoring elements, wherein the anchoring elements are formed, in particular with regard to their geometric structure and/or material composition, in such a way that the anchoring elements break, tear or detach from the components or from the intermediate carrier when the components are removed for instance by a stamp from the intermediate carrier individually or in groups and are pulled up vertically from the intermediate carrier, for example. By breaking, for instance by tearing, or by detaching the anchoring elements, the components can be transferred parallel to a target mounting surface, for instance to a video wall or illuminated surface, and mounted thereon. In this sense, the components of the component assembly are especially formed to be printable.

Preferably, the components can be electrically connected, for example externally electrically connected via their rear sides facing the intermediate carrier. The components are thus formed to be surface-mountable and can be removed from the intermediate carrier and attached, and in particular electrically connected, to the target mounting surface in a single method step. It is possible that the components each have a solder layer or solder material on their rear side.

In at least one embodiment of a method for producing a plurality of printable components on a common intermediate carrier, a plurality of electrical devices is provided. The components each have at least two electrical devices and an insulating layer, wherein at least one of the electrical devices of the component is an optoelectronic semiconductor chip. The insulating layer is formed between the electrical devices of the same component in such a way that the at least two electrical devices of the same component are arranged next to one another and are each laterally enclosed, preferably directly and completely enclosed, by the insulating layer. The insulating layer and the at least two electrical devices or all electrical devices of the same component are in particular integral parts of a self-supporting and mechanically stable unit. A plurality of anchoring elements are produced which fix the positions of the components on the intermediate carrier and release them under mechanical load when the components are removed, so that the components formed as self-supporting and mechanically stable units are detachable from the intermediate carrier. Preferably the anchoring elements are breakable or detachable under mechanical load.

Preferably, the components are formed to be individually printable. In other words, the components can be removed individually from the intermediate carrier by breaking and/or detaching the anchoring elements and, in the same process, mechanically and/or electrically can be fixed to a target mounting surface, for example with the aid of a stamp. The insulating layers or at least sublayers of the insulating layers of different components can be produced in a common process, for example in a common coating process.

According to at least one embodiment of the method, the components are formed on the single common intermediate carrier in an additive production manner. According to the additive production of a component or of the components, the intermediate carrier is first provided, wherein in particular all the electrical devices and layers of the component or of the component assembly are formed or arranged one after the other on the same intermediate carrier, i.e. in the presence of the intermediate carrier. The additive production of the component assembly is carried out in particular from above, for instance exclusively from above on the intermediate carrier. The electrical devices can be applied individually or in groups onto the intermediate carrier, wherein the electrical devices of the same component are removable from the intermediate carrier in groups after final completion of the component.

The electrical devices of the same component are held together in particular by the insulating layer. It is possible that there is no further mechanically stabilizing layer between the intermediate carrier and the devices. In this case, the mechanical stabilization of the component, for instance after the component has been removed from the intermediate carrier, is achieved exclusively by the insulating layer. The vertical height of the component can thus be kept particularly low and is determined by the vertical thickness of the insulating layer. For example, at least 80%, 90%, 95% or 98% of the total vertical height of the component is accounted for by a vertical layer thickness of the insulating layer.

According to at least one embodiment of the method, a carrier assembly is provided which is attached to the intermediate carrier by a connecting layer. The connecting layer is for instance an adhesion promoter layer and may comprise or consist of an adhesive. In particular, the carrier assembly is arranged in the vertical direction between the intermediate carrier and the electrical devices. The sacrificial layer may be located in the vertical direction between the carrier assembly and the intermediate carrier. Preferably, the components each have a carrier that arises out of the carrier assembly. The component can thus be formed to be particularly stable and can be removed from the intermediate carrier without risk of being damaged. The arrangement of the electrical devices on the carrier assembly can be carried out before or after the carrier assembly is fixed to the intermediate carrier.

According to at least one embodiment of the method, a plurality of separation trenches are formed between the components. In the vertical direction, the separation trenches can extend throughout the insulating layer and/or throughout the carrier assembly. In particular by forming the separation trenches, the carrier assembly is divided into a plurality of carriers, each of which is assigned to one of the components.

In at least one embodiment of a component assembly, it comprises an intermediate carrier, a plurality of components arranged thereon and a plurality of anchoring elements. The components each comprise at least two electrical devices and an insulating layer, wherein at least one of the electrical devices of the component is an optoelectronic semiconductor chip, for example an LED. The component may have a plurality of semiconductor chips or LEDs. The anchoring elements are formed to fix or at least temporarily fix the positions of the components on the intermediate carrier, wherein the components formed as self-supporting and mechanically stable units are detachable from the intermediate carrier. Preferably, the anchoring elements are formed in such a way that the anchoring elements release the components under mechanical load when the latter are removed. Preferably, the anchoring elements are formed such that they are breakable or detachable under mechanical load.

Preferably, the insulating layer is arranged in places between the electrical devices of the same component, wherein the at least two electrical devices of the same component are arranged next to each other and are each enclosed laterally by the insulating layer. In particular, the at least two electrical devices and the insulating layer of the same component are formed as integral parts of a self-supporting and mechanically stable unit. For example, the insulating layer directly adjoins the two or all electrical devices or semiconductor chips. In particular, the insulating layer and the electrical devices of the same component are integral parts of that component.

According to at least one embodiment of the method or of the component assembly, the components of the component assembly can be mechanically decoupled from the intermediate carrier individually or in groups by vertical lifting. An adhesive stamp can be used for this purpose. The anchoring elements are formed to be breakable, i.e. in particular tearable, or detachable from the components, when the component or components are lifted vertically.

According to at least one embodiment of the method or of the component assembly, the insulating layer and the electrical devices form a self-supporting and mechanically stable unit. In particular, a self-supporting and mechanically stable unit is understood to be a component which is self-supporting and does not fall apart under its own weight. In other words, the insulating layer and the electrical devices of the same component alone already form a contiguous structure which can be transferred, for example by an adhesive stamp, from an initial position, for example from the component assembly, to a target surface, for example to a mounting surface. Preferably, the insulating layer directly adjoins the electrical devices, in particular all electrical devices. The insulating layer and the electrical devices are thus formed as contiguous parts of the component. The component can have exactly two, three, four or exactly five electrical devices. It is possible that the component has a single contiguous insulating layer which directly adjoins the devices, in particular all devices.

According to at least one embodiment of the method or of the component assembly, the component of the assembly has a total vertical height which is, in particular, between 3 µm and 120 µm inclusive, between 3 µm and 90 µm inclusive, between 4 µm and 60 µm inclusive, between 4 µm and 30 µm inclusive or between 4 µm and 10 µm inclusive. It is possible that the total vertical height of the component is essentially given by a vertical thickness of the insulating layer. In particular, at least 80%, 90%, 95% or 98% of the total vertical height of the component may be accounted for by the vertical thickness of the insulating layer.

The component has a lateral width and/or a lateral length which is, for example, between 40 µm and 400 µm inclusive, for instance between 40 µm and 300 µm inclusive, between 40 µm and 200 µm inclusive or between 40 µm and 100 µm inclusive. It is possible for all components of the component assembly to have overall vertical heights and/or lateral widths and/or lateral lengths in the above-mentioned ranges. For example, the component has lateral dimensions of 200 µm×200 µm and a total vertical height of a few micrometers, for instance 4 µm or 10 µm. Such a component is also considered to be self-supporting and mechanically stable if the component is self-supporting during transfer or after removal from the component assembly and does not fall apart under its own weight.

According to at least one embodiment of the method or of the component assembly, each component has at least three electrical devices, wherein the at least three electrical devices are three optoelectronic semiconductor chips. The three optoelectronic semiconductor chips are preferably a red light emitting semiconductor chip, a green light emitting semiconductor chip and a blue light emitting semiconductor chip. It is possible that the component has one further electrical device or several further electrical devices, in particular for driving the optoelectronic semiconductor chip or chips, wherein the further device is an integrated circuit or the further devices are integrated circuits.

According to at least one embodiment of the method or of the component assembly, the anchoring elements comprise anchoring tethers which are formed at least in places sidewards of the components and are formed to be mechanically breakable or detachable when the components are removed. Alternatively or additionally, the anchoring elements may comprise anchoring posts which are arranged in the vertical direction for instance exclusively between the intermediate carrier and the components. The anchoring posts are formed to be mechanically breakable or detachable, particularly when the components are removed from the intermediate carrier.

According to at least one embodiment of the method or of the component assembly, the anchoring elements are formed to be electrically insulating. Alternatively, it is possible that the anchoring elements are formed to be electrically conductive or at least in some areas are formed to be electrically conductive. It is possible that the component assembly has both electrically insulating anchoring elements and electrically conductive anchoring elements. For example, the anchoring tethers are electrically insulating and the anchoring posts are electrically conductive, or vice versa. It is possible that both the anchoring tethers and the anchoring posts are electrically insulating or electrically conductive. It is also possible that some of the anchoring tethers and/or anchoring posts are insulating and the other anchoring tethers and/or anchoring posts are electrically conductive.

According to at least one embodiment of the method or of the component assembly, the components and/or the electrical devices are formed so that they can be tested individually or in groups, for example with regard to their functionality. In particular, the components to be tested in the same group may be electrically connected to each other via the electrically conductive anchoring elements and/or via conductor tracks arranged on the intermediate carrier and thus may be formed so that they can be tested simultaneously. It is possible that the components each have at least one connection pad or several connection pads on their front side facing away from the intermediate carrier, wherein the connection pad or the plurality of connection pads are formed to receive a probe needle or test needle for current injection into the component during a quality test of the functionality of the associated component and/or of the electrical devices.

As an alternative or in addition, the component assembly can have connection pads on its front side remote from the intermediate carrier, which are arranged laterally to the components. The laterally arranged connection pads can be electrically connected to the components to be tested by conductor tracks and/or by electrically conductive anchoring elements. In this case, the component may be free of connection pads on its front side.

According to at least one embodiment of the method or of the component assembly, the devices each have electrical contacts which are configured for the electrical contacting of the devices. The electrical contacts can be arranged exclusively on a top side or on a bottom side or partly on the top side and partly on the bottom side of the respective devices. If the devices are laterally enclosed by the insulating layer, the electrical contacts of the respective devices can be arranged exclusively on a top side or on a bottom side or partly on the top side and partly on the bottom side of the insulating layer.

According to at least one embodiment of the method or of the component assembly, the anchoring elements, in particular the electrically conductive anchoring tethers and/or the electrically conductive anchoring posts, are located at least on two different vertical levels of the component assembly. The different vertical levels of the component assembly can be located at the vertical height of the insulating layer, within the insulating layer, above the insulating layer—i.e. on or above the front side of the component assembly or component—and below the insulating layer—i.e. on or below the rear side of the component assembly or component. For example, the electrically conductive anchoring elements are located on two different metallization levels.

According to at least one embodiment of the method or of the component assembly, the components are formed to be testable with regard to their functionality via a cross-matrix circuit. The cross-matrix circuit can comprise the anchoring elements in certain places which are formed to be electrically conductive. The cross-matrix circuit can be located in places or completely underneath the insulating layer. If the cross-matrix circuit is located below the insulating layer, the cross-matrix circuit is located on a surface of the insulating layer facing the rear side of the component or on the rear side of the component or between the insulating layer and the rear side of the component assembly.

According to at least one embodiment of the method or of the component assembly, the electrical devices are electrically connected to contact layers of the associated component. The contact layers are configured for external electrical contacting of the components. The contact layers can be arranged between the intermediate carrier and the electrical devices in such a way that the contact layers are freely accessible after the components have been detached from the intermediate carrier. The contact layers are freely accessible if they are exposed or only covered by a further electrically conductive layer and are in electrical contact with this further layer. The further electrically conductive layer may be an electrically conductive solder layer or an electrically conductive metal layer.

In particular, the component has at least two contact layers on its rear side, wherein the at least two contact layers are assigned to different electrical polarities of the component. The component is thus electrically externally connectable via its rear side and is formed so that in this sense, it is surface-mountable. It is possible for the component to have at least one separate contact layer on the rear side of each of its electrical devices. Via these contact layers the electrical devices, in particular the optoelectronic semiconductor chips, of the same component can be individually electrically connected and activated.

According to at least one embodiment of the method or of the component assembly, a sacrificial layer, for example made of silicon, is arranged in the vertical direction between the components and the intermediate carrier. In particular, the sacrificial layer is formed to be removable, for instance by an etching process such as a plasma etching process. In particular, the sacrificial layer forms a common boundary between the intermediate carrier and the components. It is possible that after removal of the sacrificial layer, the components are held on the intermediate carrier solely by the anchoring elements. This means that the components can be mechanically decoupled from the intermediate carrier by removing or breaking the anchoring elements alone. In particular, the anchoring elements are directly adjacent to the components. The anchoring elements can be directly or indirectly adjacent to the intermediate carrier or to a layer arranged on the intermediate carrier, which in particular is not part of the component or components.

According to at least one embodiment of the method or of the component assembly, a cavity is formed between adjacent components and/or between the components and the intermediate carrier. The cavity may be formed by the separation trenches between the adjacent components or by removing the sacrificial layer. In a plan view of the front side of the component assembly, the cavity may be covered or bridged in places by one or several anchoring tethers. In particular, the anchoring elements directly adjoin the cavity in places. It is possible that the cavity located between adjacent components directly adjoins a further cavity, wherein the further cavity is formed for instance exclusively by a space exposed by removing the sacrificial layer.

According to at least one embodiment of the method or of the component assembly, after mechanical decoupling from the intermediate carrier, the components each have a vertical height, wherein at least 90%, 95% or 98% of the vertical height of the component are accounted for by a sum of the vertical layer thickness of the insulating layer and a vertical layer thickness of a carrier of the associated component. In particular, before decoupling, the carrier of the associated component is arranged in the vertical direction between the intermediate carrier and the electrical devices. In addition to the insulating layer, the carrier can be formed as a further mechanically stabilizing layer of the component. Alternatively, it is possible that the components are each free of such a carrier. The insulating layer can serve as the only mechanically stabilizing layer of the respective component. In this case, after mechanical decoupling from the intermediate carrier, the components can each have a vertical height, wherein at least 80%, 90%, 95% or 98% of the vertical height of the component can be accounted for by a vertical layer thickness of the insulating layer. This means that there is no further platform or carrier for the component above or below the insulating layer.

The method described here is particularly suitable for the production of a component or of a component assembly described here. The features described in connection with the component or with the component assembly can therefore also be used for the method, and vice versa.

Further preferred embodiments and further developments of the component, the component assembly and of the method will become apparent from the exemplary embodiments explained below in conjunction with FIGS. 1A to 9D.

Figure 1B:
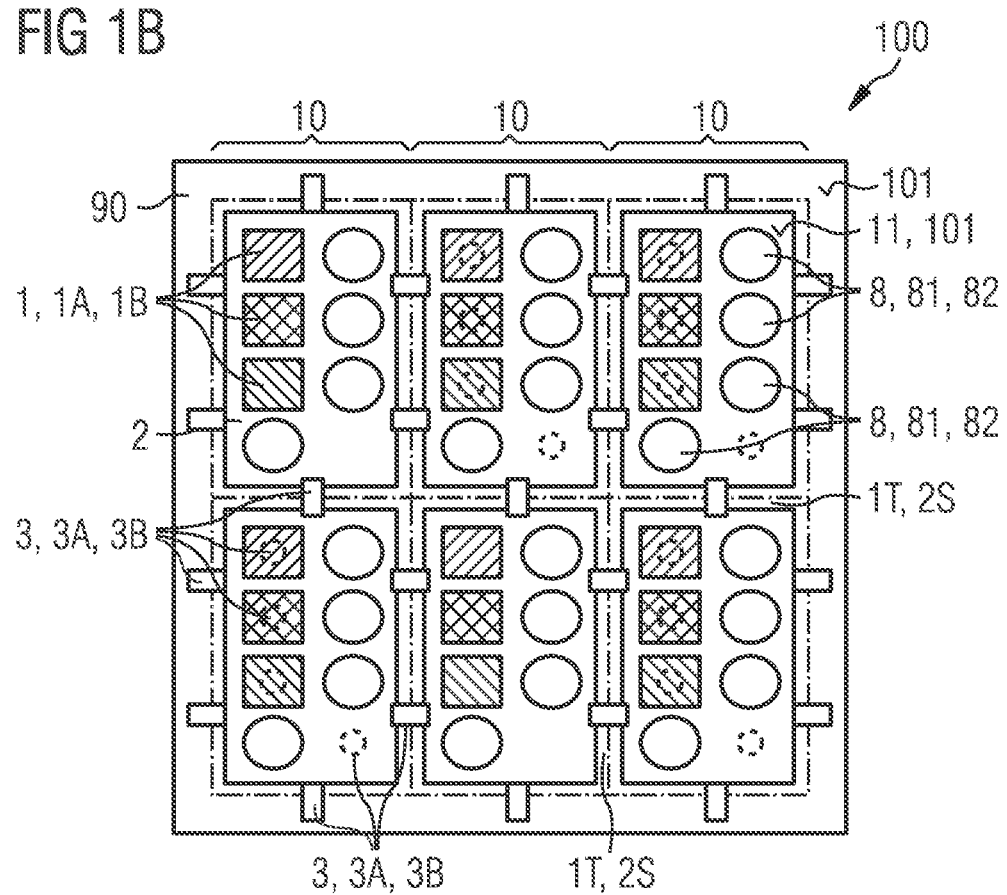
Figure 1C:
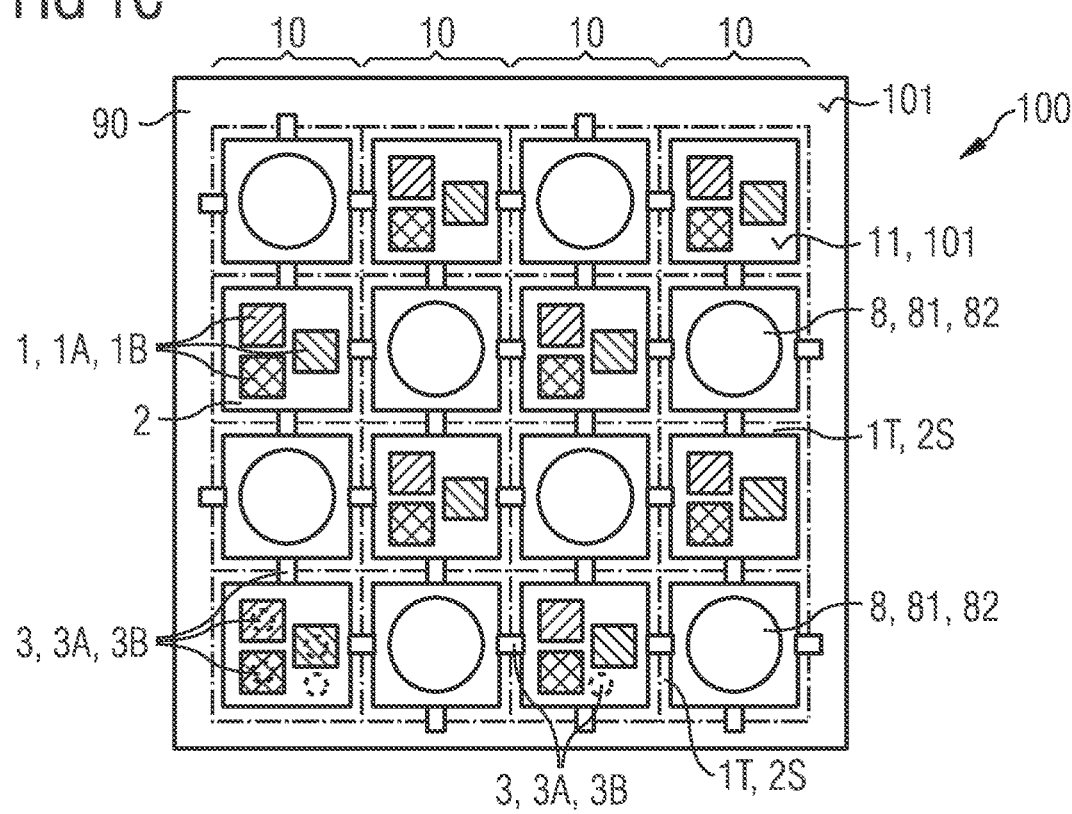
Figure 1D:
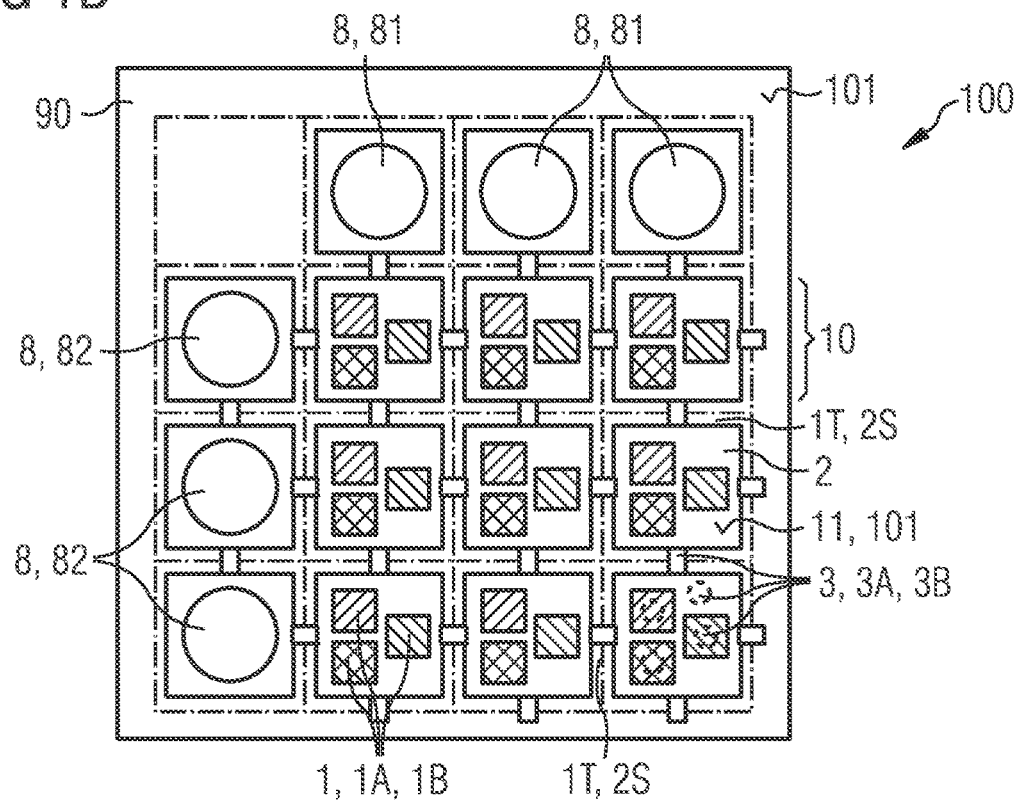
Figure 2G:
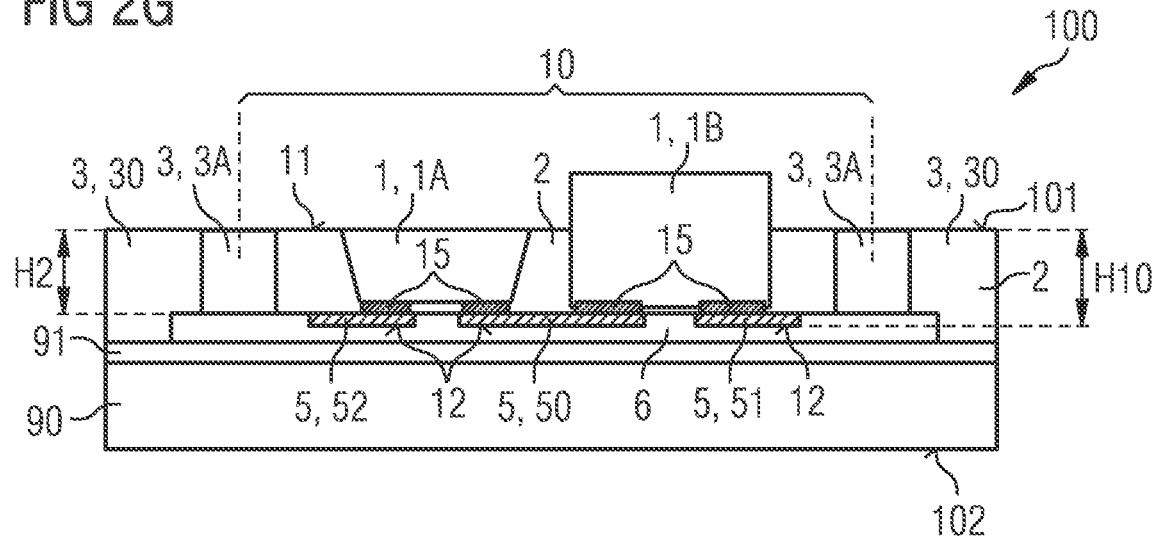
Figure 2H:
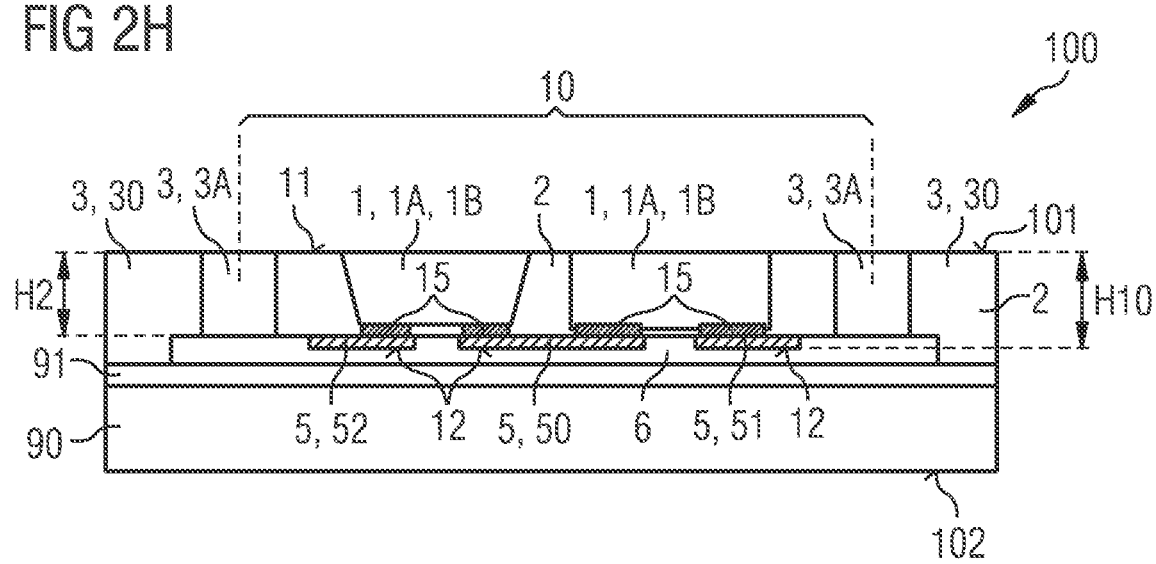
Figure 2I:
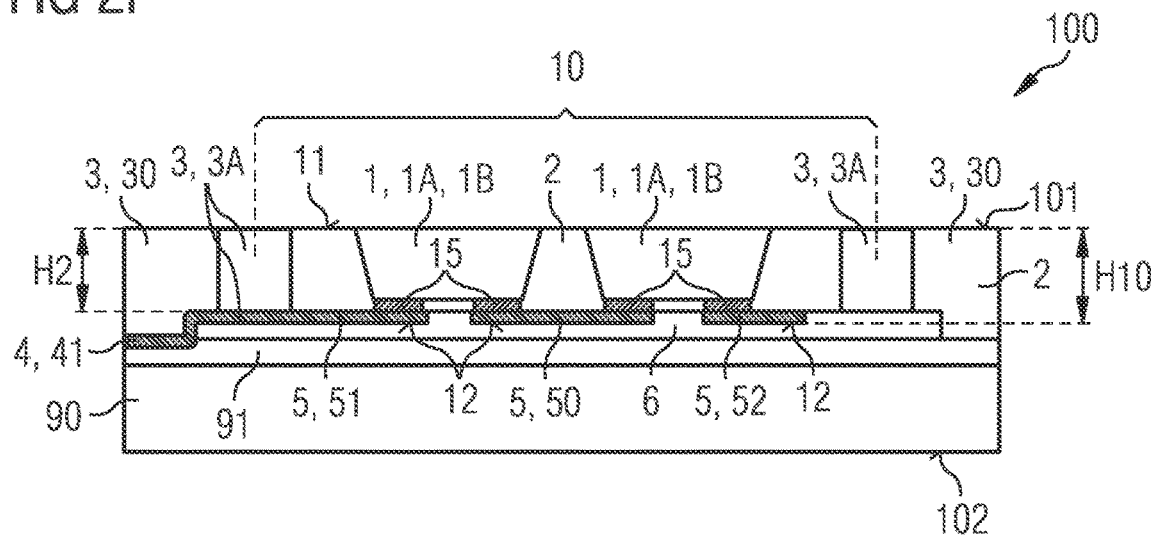
Figure 2J:
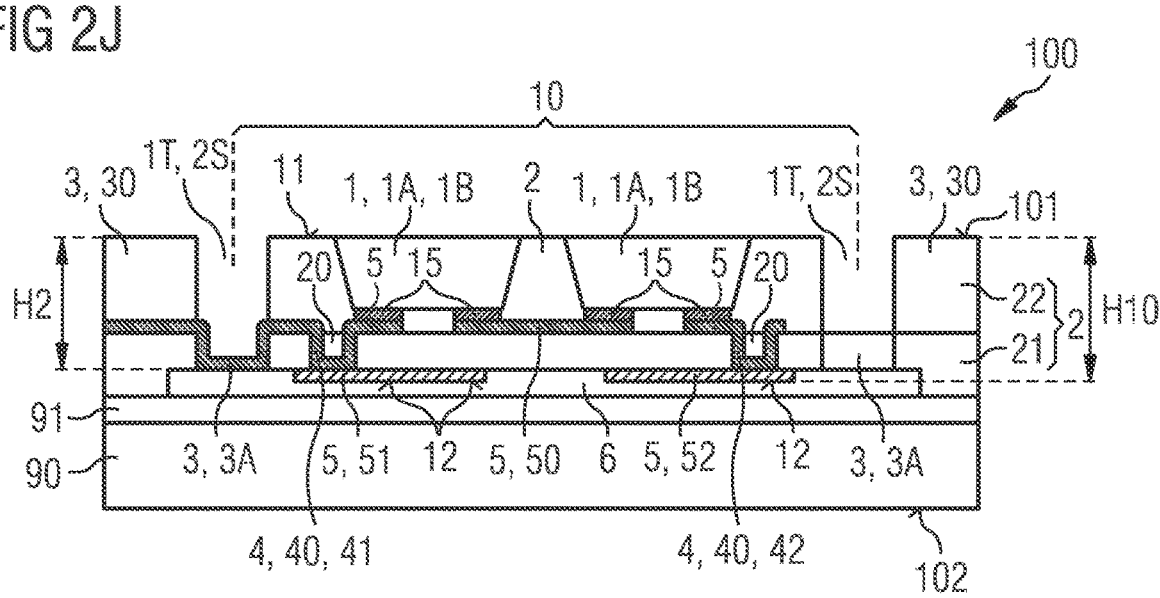
Figure 2K:
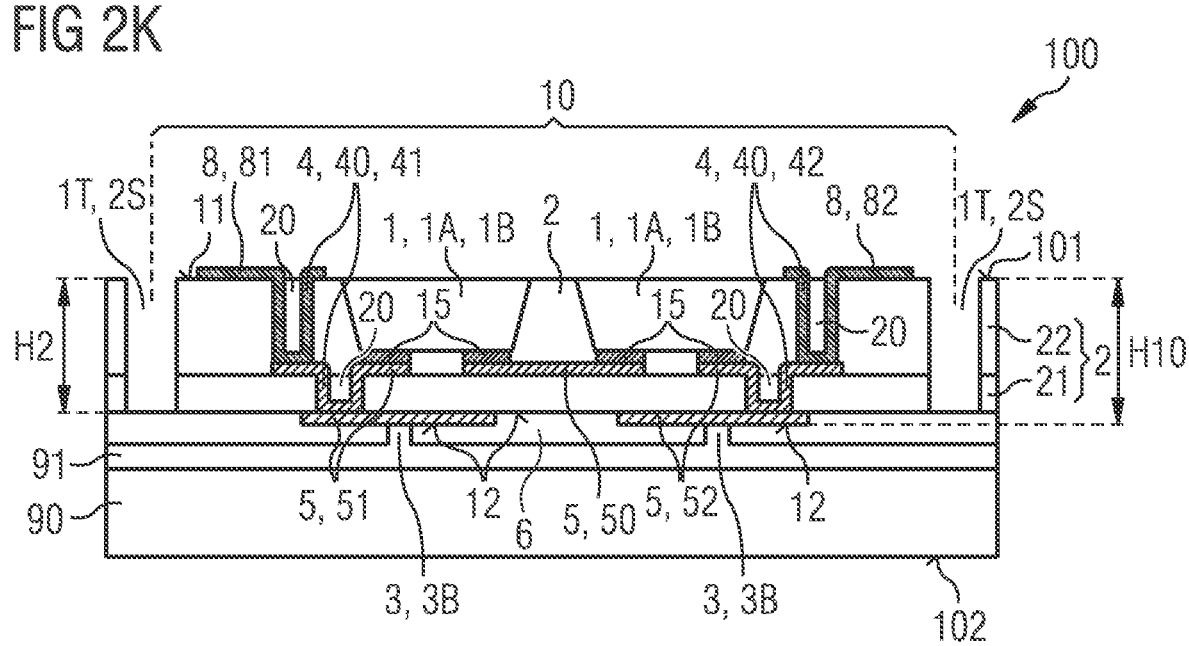
Figure 2L:
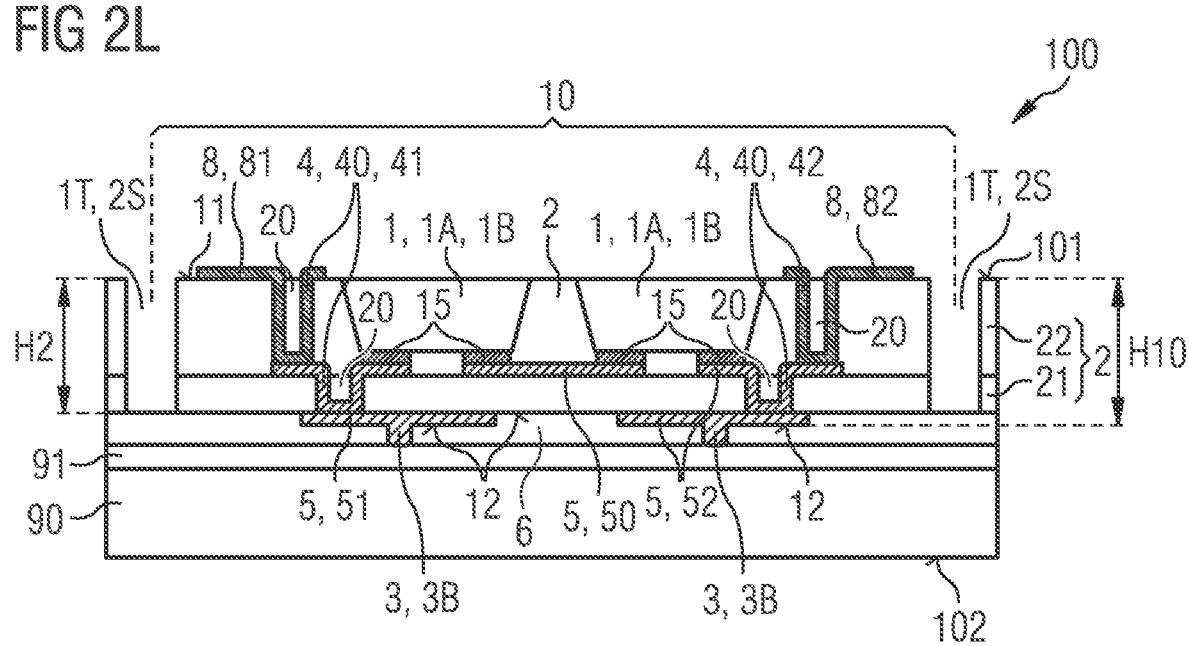
Figure 2M:
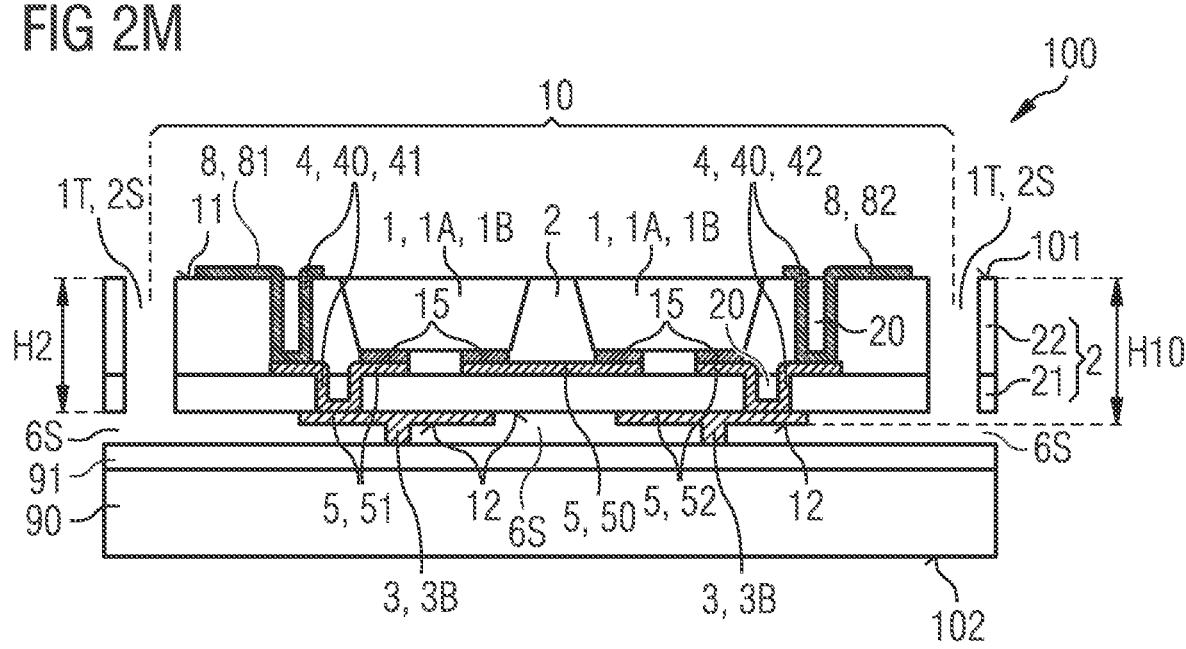
Figure 2N:
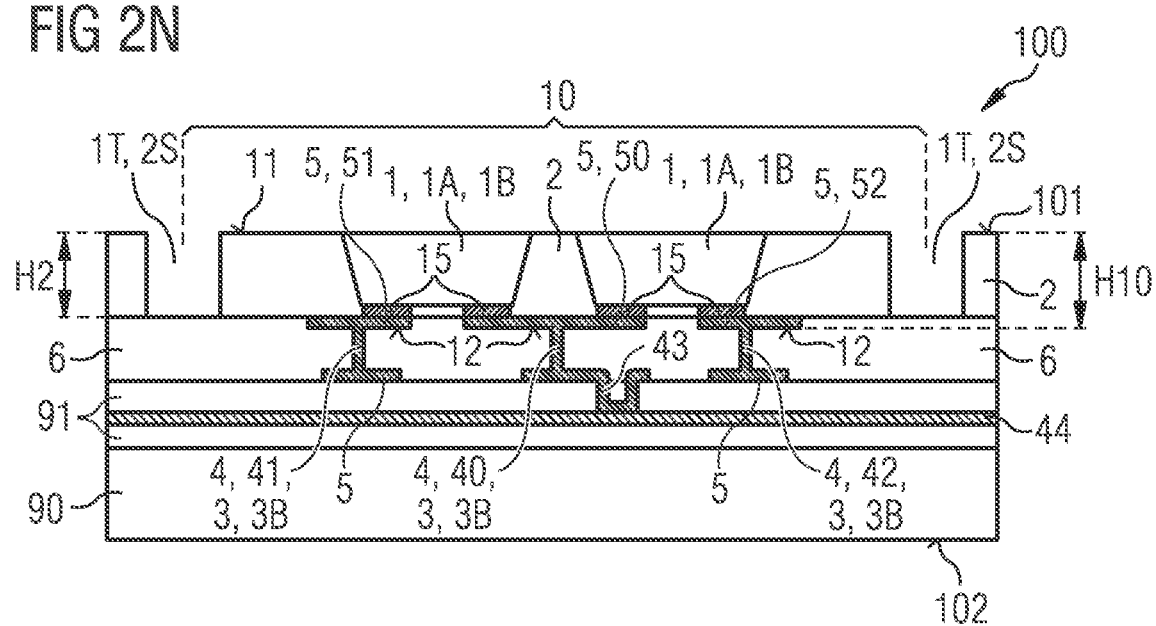
Figure 20:
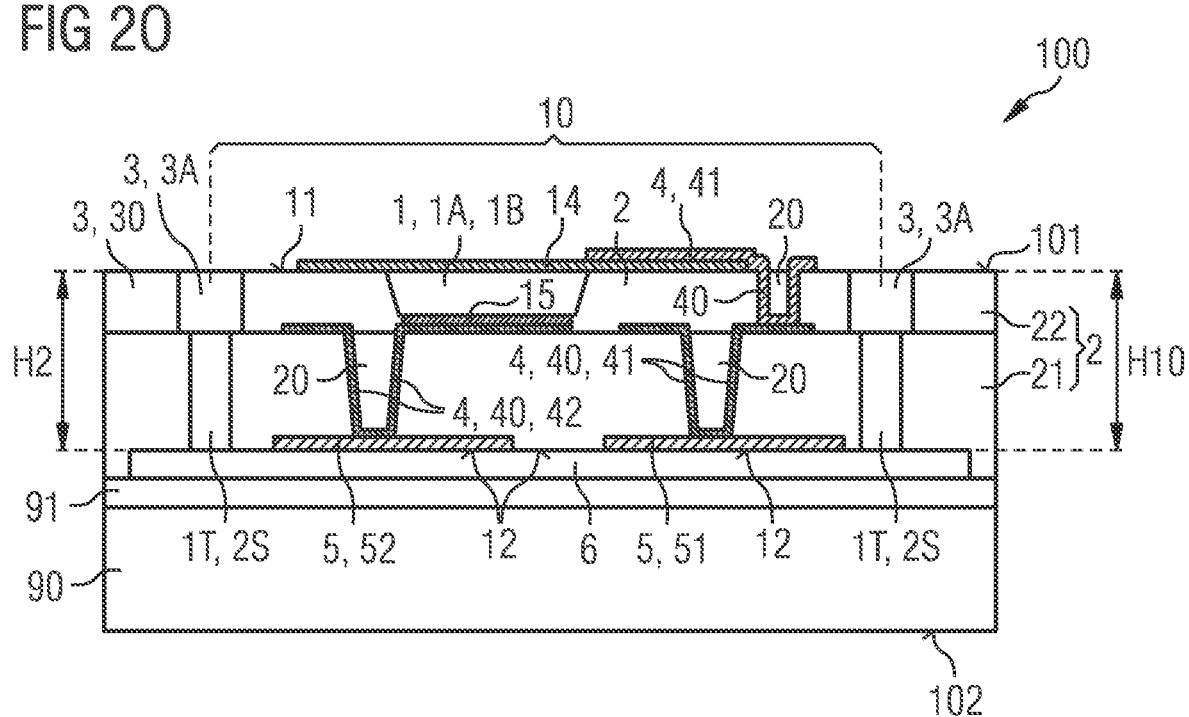
Figure 3A:
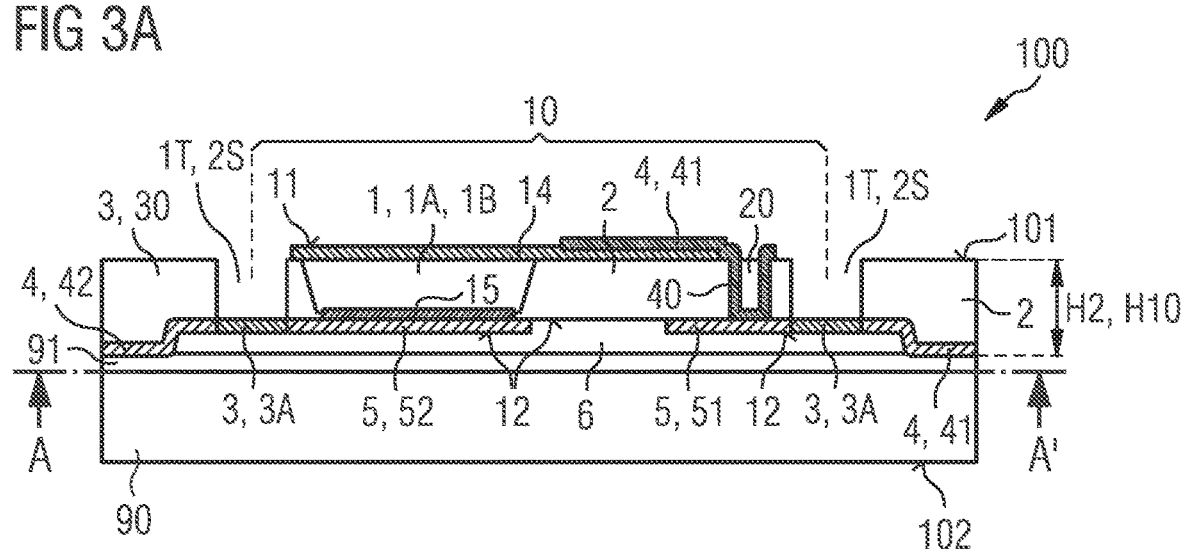
Figure 3B:
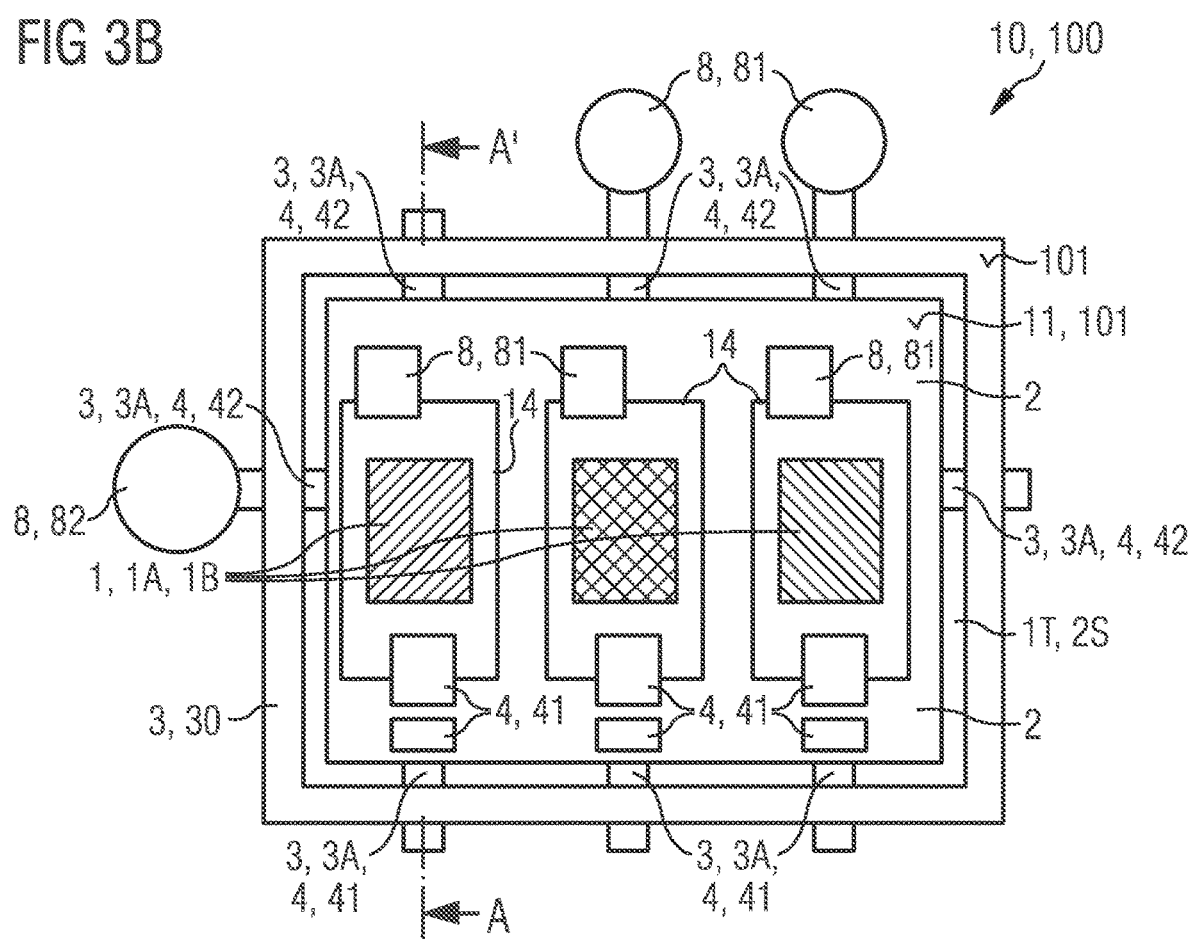
Figure 5C:
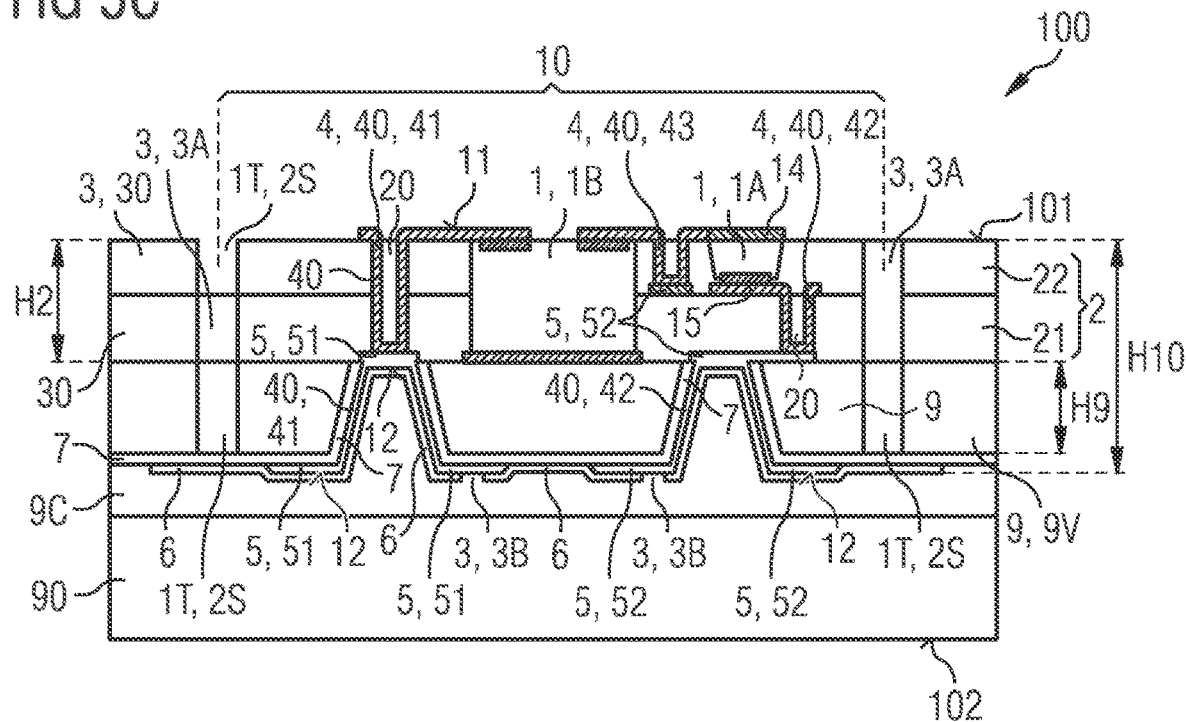
Figure 5D:
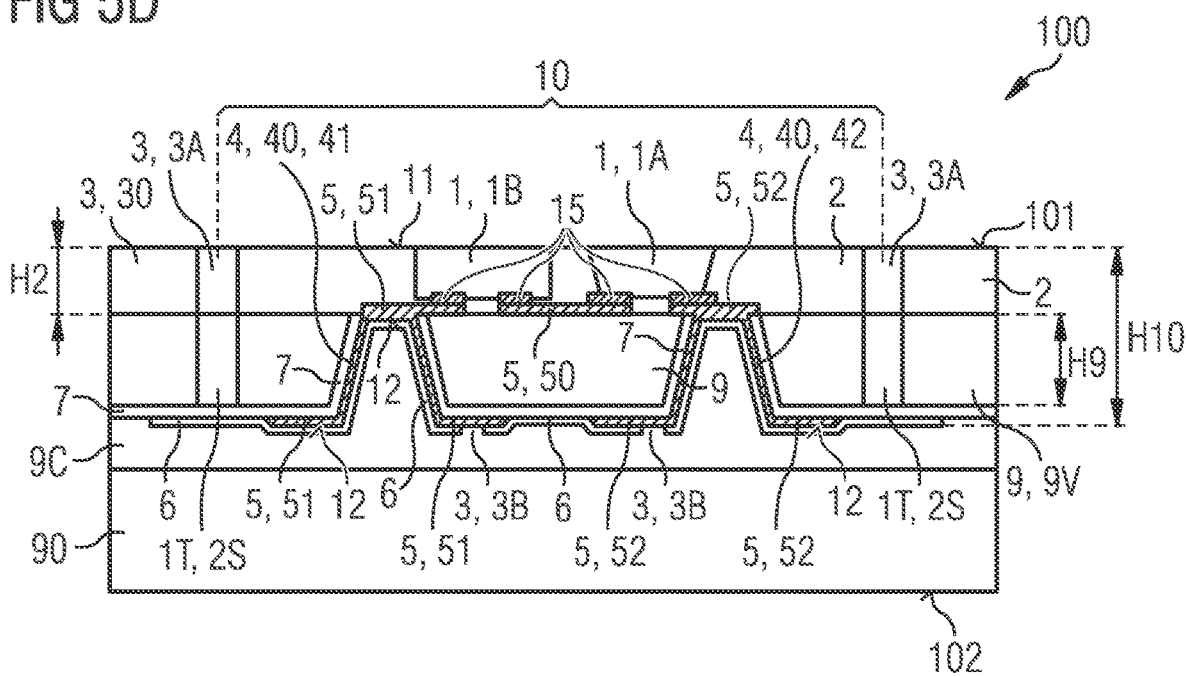
Figure 5E:
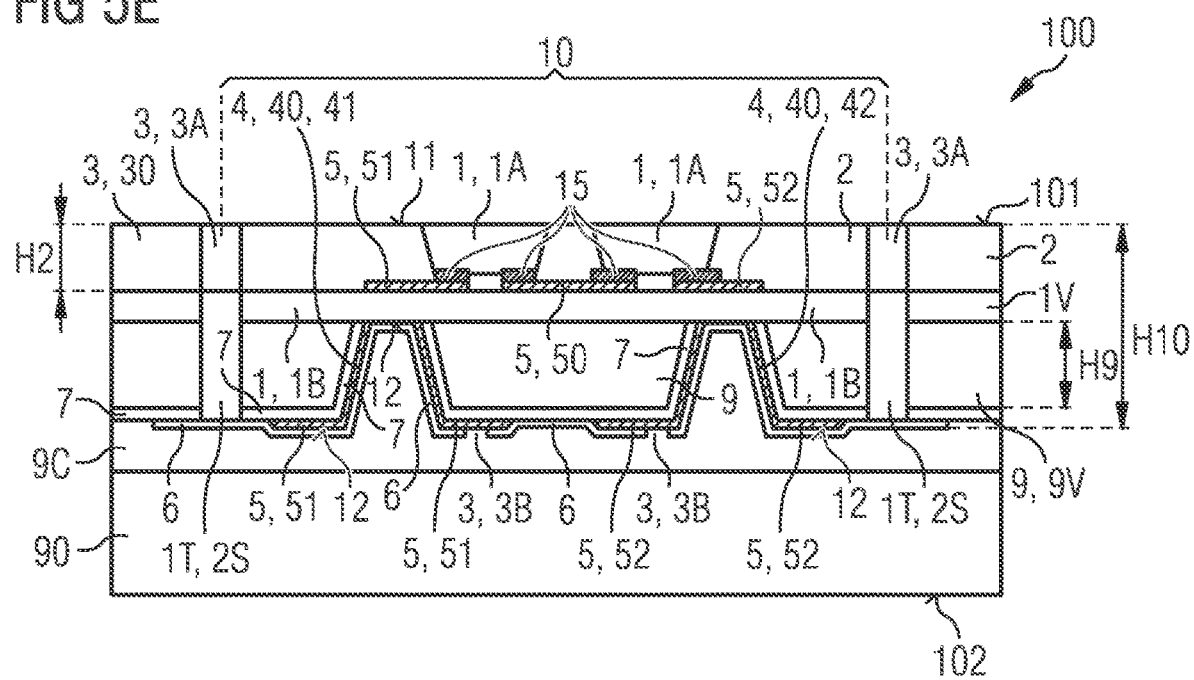
Figure 5F:
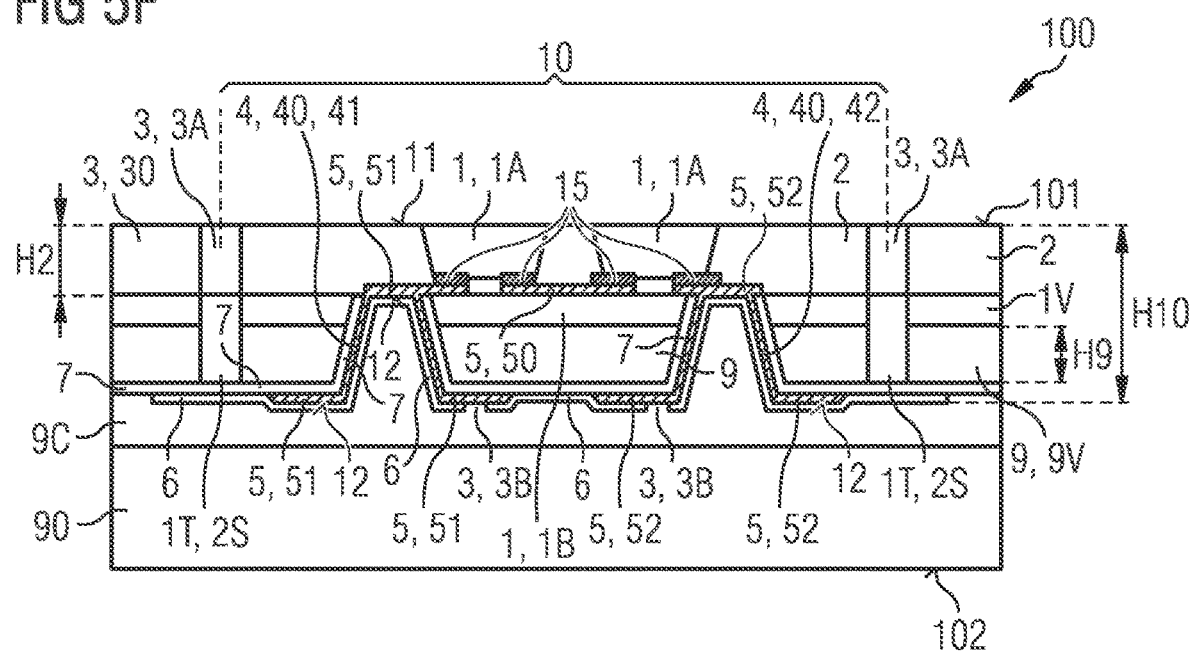
Figure 5G:
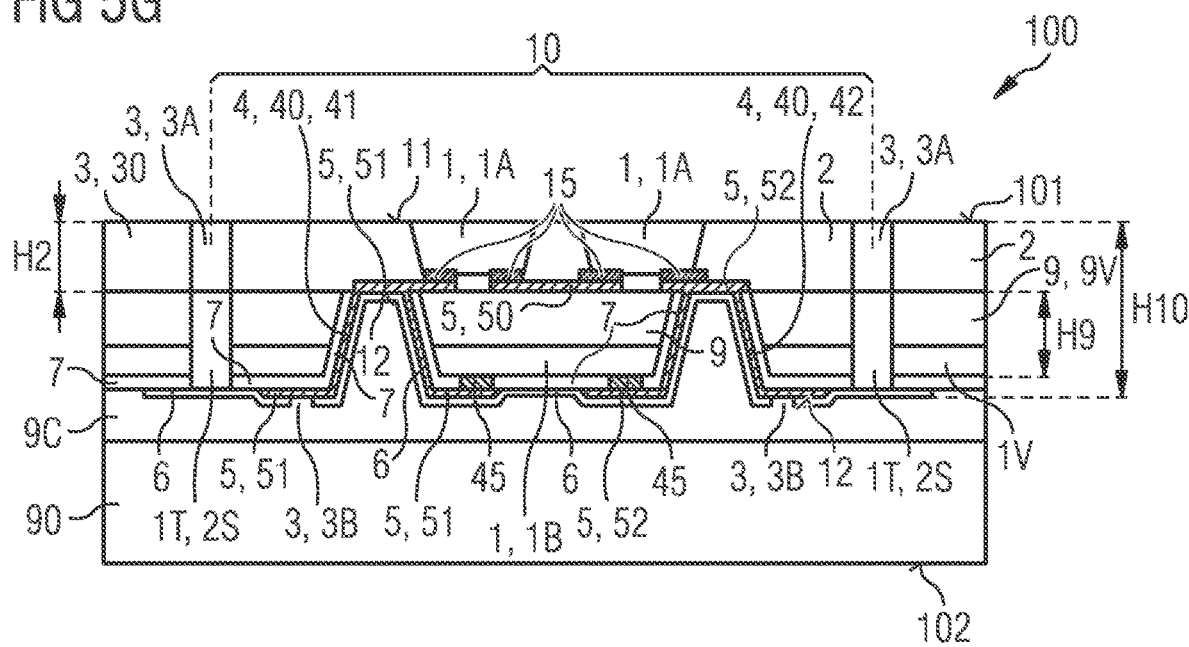
Figure 5H:
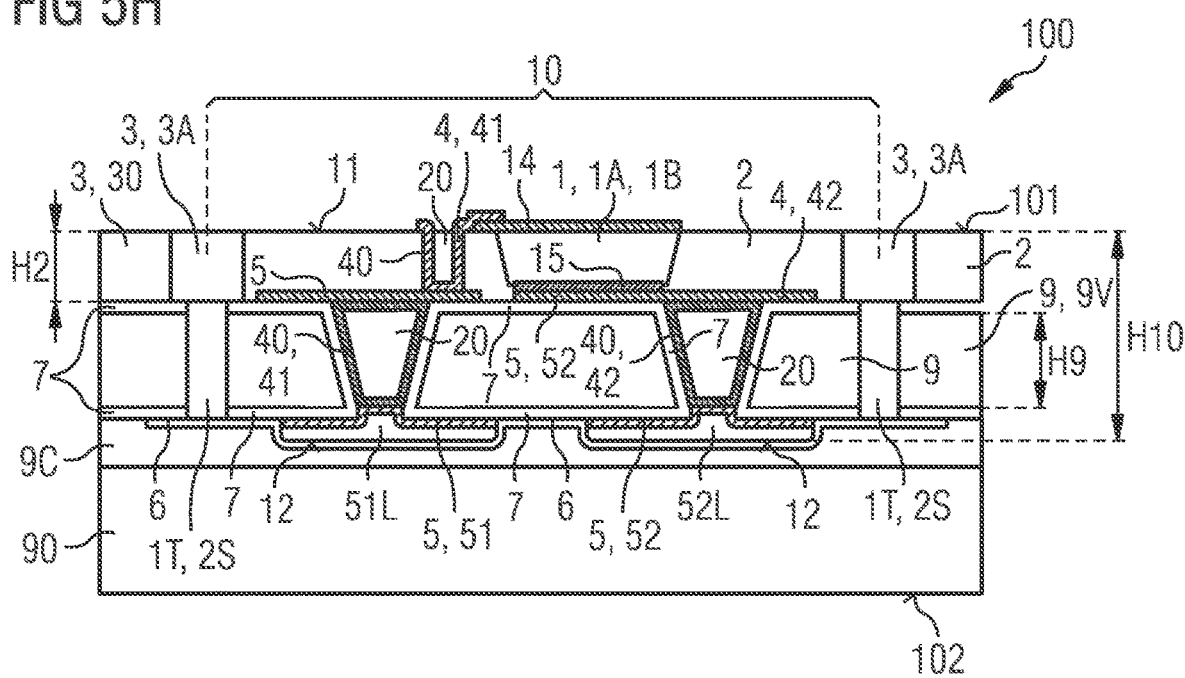
Figure 6A:
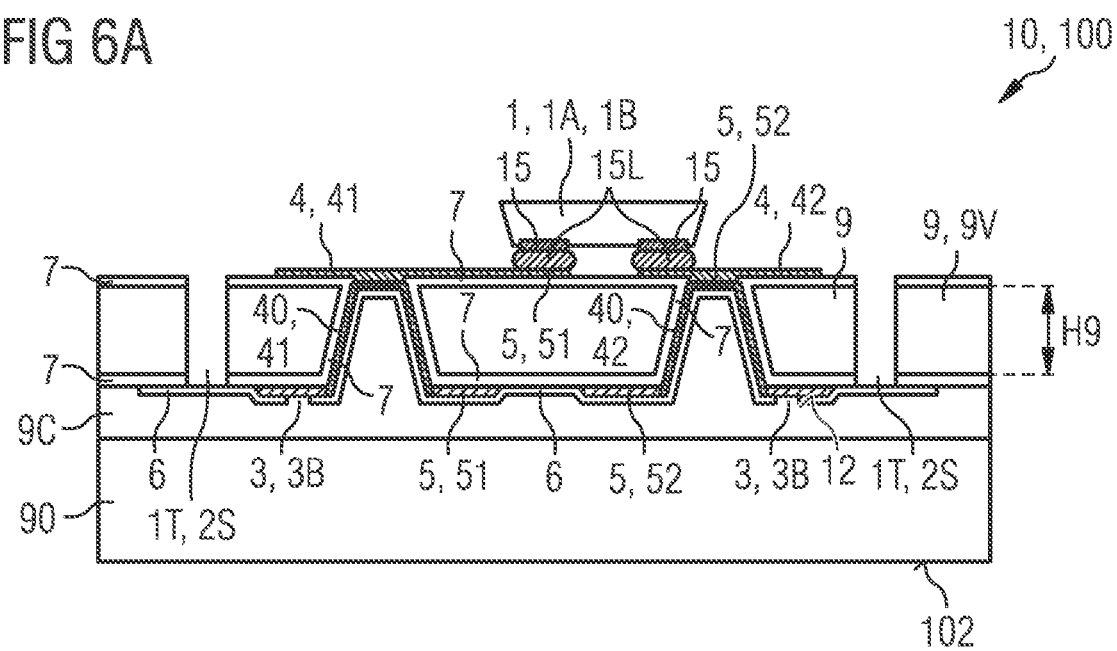
Figure 6B:
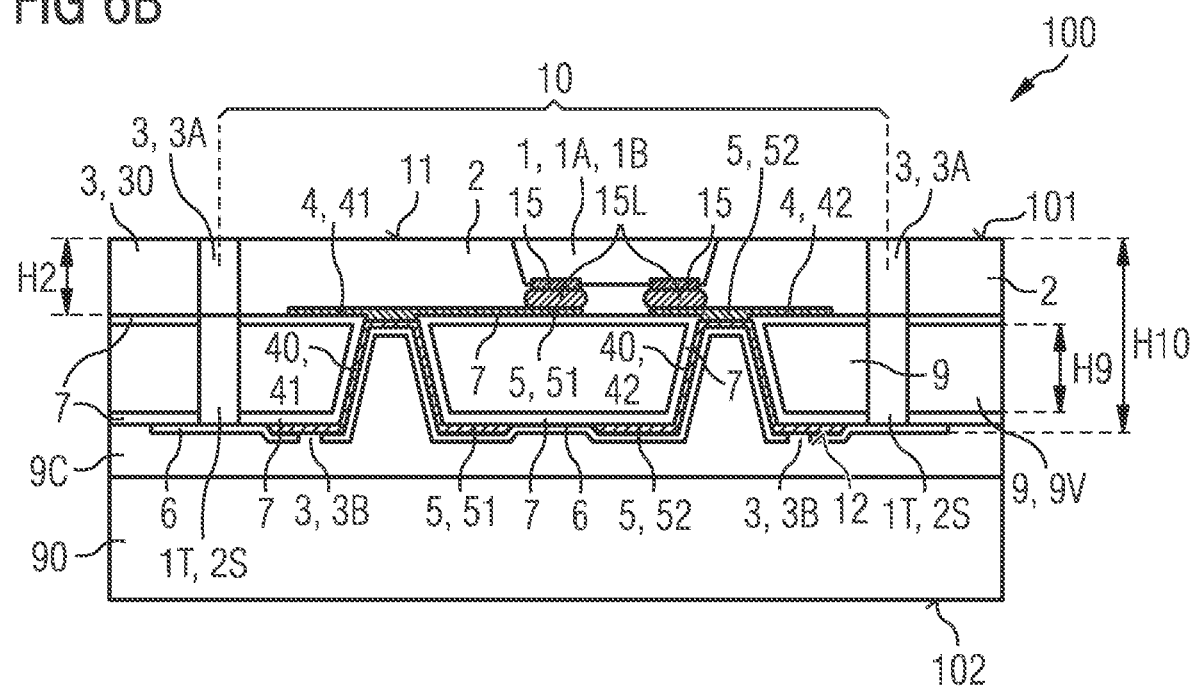
Figure 6C:
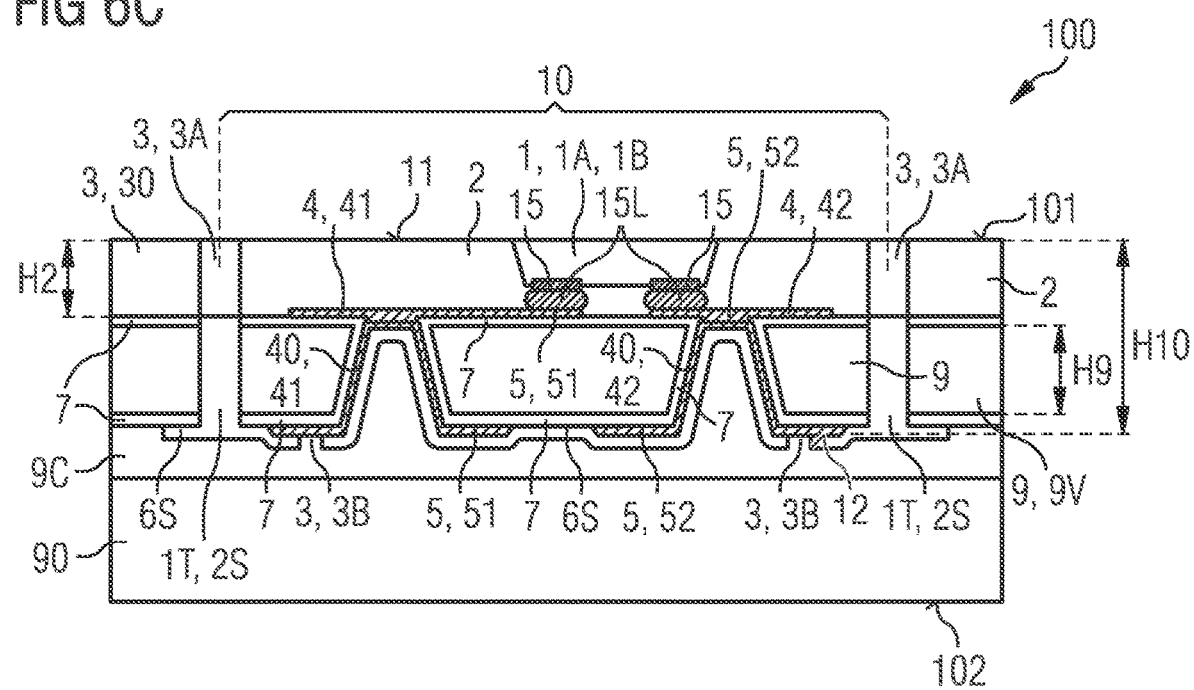

FIG. 1A shows a schematic representation of a process sequence for producing a component assembly, FIGS. 1B, 1C and 1D show some exemplary embodiments of a component assembly in top view, FIGS. 2A, 2B, 2C, 2D, 2E, 2F, 2G, 2H, 2I, 2J, 2K, 2L, 2M, 2N, and 2O show schematic sectional views of further exemplary embodiments of a component assembly, FIGS. 3A, 3B and 3C show schematic representations of further exemplary embodiment of a component assembly in sectional view and in top view as well as a schematic representation of a possibility to test the components of the component assembly, FIGS. 4A, 4B and 4C show schematic representations of further exemplary embodiments of a component assembly, FIGS. 5A, 5B, 5C, 5D, 5E, 5F, 5G and 5H show schematic representations of further exemplary embodiments of a component assembly in sectional views, FIGS. 6A, 6B and 6C show schematic representations of some of the method steps of an exemplary embodiment of a method for producing a plurality of the components, FIGS. 7A, 7B, 7C, 7D, 7E, 8A and 8B show schematic representations of further method steps of a further exemplary embodiment of a method for producing a plurality of the components, and FIGS. 9A, 9B, 9C and 9D show possible entire process flows of a method for producing a plurality of the components.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

FIG. 1A shows a component assembly 100 in the form of a wafer composite. The component assembly 100 has a plurality of electrical devices, which can be optoelectronic semiconductor chips. The electrical devices can be LEDs that arise out of different semiconductor wafers (left) and are assembled in series or parallel on an intermediate carrier of the component assembly 100 by a transfer process.

The component assembly 100 can have a plurality of components 10 (FIGS. 1B, 1C and 1D), which can each have a plurality of electrical devices 1, 1A and 1B. In particular, the components 10 can be picked out individually or in groups from the intermediate carrier 90, for example by a stamp, and transferred to a target mounting surface (right in FIG. 1A). The target mounting surface can be an illuminated area, a display surface or a video wall. If, for example, a component 10 is picked up from the intermediate carrier 90 by a stamp and, in particular, mounted on the target mounting surface in the same method step, the component 10 is said to be printable. The printable components 10 can thus be transported parallel to the target mounting surface and mounted on the target mounting surface in the same method step.

FIG. 1B schematically shows the component assembly 100 in a top view on the front side 101 of the component assembly 100. The component assembly 100 has an intermediate carrier 90 on which the components 10 are arranged in rows and columns. The intermediate carrier 90 can be made of silicon and is, for example, a SOI wafer (silicon-on-insulator wafer). The components 10 are laterally spaced from each other by a plurality of separation trenches 1T. The component assembly 100 has a plurality of anchoring elements 3, for example in the form of anchoring tethers 3A and anchoring posts 3B, which fix the positions of the components 10 on the intermediate carrier 90. The components 10 can be picked up from the intermediate carrier 90 by breaking or by detaching the anchoring elements 3, 3A and 3B, for example by vertically lifting the components 10.

In FIG. 1B, the component assembly 100 has a plurality of anchoring elements 3 which are formed as anchoring tethers 3A. In a plan view of the front side 101, the anchoring tethers 3A are arranged in places sidewards to the components 10. Each of the anchoring tethers 3A can bridge a separation trench 1T located below. The separation trench 1T can be a cavity 2S between the components 10. The component assembly 100 can have a plurality of anchoring elements 3 which are formed as anchoring posts 3B. In the vertical direction, the anchoring posts 3B are arranged between the intermediate carrier 90 and the components 10. In a plan view of the front side 101 of the component assembly 100, the anchoring posts 3B are covered, especially completely, by the components. In FIG. 1B, the anchoring posts 3B are shown schematically by dotted circles.

Preferably, the anchoring elements 3, 3A and 3B are formed, for example with regard to their material composition and/or geometrical structure, in such a way that they are broken, torn or separated from the intermediate carrier 90 or from the components 10 as soon as the component 10 or the plurality of components 10 are lifted or raised along the vertical direction. Along the lateral directions, there are in particular gaps or cavities 2S between the components 10, wherein the cavities 2S are formed in particular by the separation the trenches 1T. Along the vertical direction, a further intermediate area or cavity may be formed between the intermediate carrier 90 and the components 10, so that the components 10 are held on the intermediate carrier 90, for example, solely by the anchoring elements 3A and 3B and may be mechanically decoupled from the intermediate carrier 90, in particular by breaking or detaching the anchoring elements 3A and 3B.

The components 10 each have a plurality of electrical devices 1. The electrical devices 1 can be optoelectronic semiconductor chips 1A or integrated circuits 1B. The integrated circuits 1B may be in the form of a chip (IC chip) and are formed in particular for driving the optoelectronic semiconductor chips 1A. The integrated circuit 1B may contain a transistor.

Each component 10 comprises an insulating layer 2. In particular, the insulating layer 2 is formed such that the electrical devices 1 or at least the optoelectronic semiconductor chips 1A, in particular all optoelectronic semiconductor chips 1A, are completely enclosed by the insulating layer 2 in lateral directions. In particular, the insulating layer 2 and the electrical devices 1 form a self-supporting and mechanically stable unit, wherein the insulating layer 2 can directly adjoin the electrical devices 1, in particular all the electrical devices 1. The insulating layer 2 and the electrical devices 1 are thus formed as integral parts and/or as contiguous components of the component 10. The insulating layer 2 can be formed as a continuous layer. A front side 11 of the component 10 is formed in in places by a surface of the insulating layer 2. The front side 101 of the component assembly 100 can be formed in places by the front sides 11 of the components 10. The side surfaces of the component 10, in particular all side surfaces of the component 10, can be partially or completely formed by surfaces of the insulating layer 2.

Each component 10 may have a plurality of connection pads 8 on the front side 11. For example, each of the connection pads 8 is electrically connected to at least one of the electrical devices 1. The component 10 may have one or a plurality of first connection pads 81 and/or second connection pads 82. An electrical component 1 or a group of electrical components 1 can be externally electrically contacted via the first connection pad 81 and/or the second connection pad 82. Via the connection pads 8, an electrical current can be impressed into the component 10, for example into the electrical device 1 or into the electrical devices 1, whereupon the functionality of the electrical devices 1 or of the component 10 can be tested before or after the mechanical decoupling from the intermediate carrier 90. According to FIG. 1B, the electrical devices 1 and/or components 10 can be tested individually or in groups using a plurality of probe needles.

The exemplary embodiment shown in FIG. 1C essentially corresponds to the exemplary embodiment shown in FIG. 1B for a component assembly 100. In contrast, the connection pads 8, 81 and 82 are arranged laterally next to the components 10. The front side 11 of the component 10 can be free of such connection pads 8. In particular, the anchoring elements 3, such as the anchoring tethers 3A, are formed to be electrically conductive. The anchoring tethers 3A can be used to electrically connect the components 10 with the connection pads 8. The connection pads 8 can thus be formed sufficiently large so that the probe needles can be easily placed on the connection pad 8 without great adjustment effort. In this case, the size of the components 10 can be kept particularly small, wherein the active illuminated area of the component 10 is effectively increased.

In FIG. 1C, the components 10 and the connection pads 8 are arranged alternately in each row and column. The adjacent components 10 share common connection pads 8. For example, with its neighbors, a component 10 uses four adjacent connection pads 8. In contrast to FIG. 1C, in FIG. 1D, the connection pads 8 are arranged in a cross-matrix circuit. The first connection pads 81 and the second connection pads 82 are each located at one edge of the component assembly 100. In particular, the component 10 itself has no connection pads 8. Such an arrangement of connection pads 8 results in a cross-matrix circuit, wherein one row or column of the components 10 or any number of the components 10 in one column or row can be tested simultaneously, for instance using only two probe needles. The probe procedure can thus be carried out more quickly and cost-effectively in a targeted manner.

FIG. 2A schematically shows a component assembly 100 along a sectional area AA' (compare FIG. 2B). The component assembly 100 has a sacrificial layer 6 which is arranged in the vertical direction between the intermediate carrier 90 and the component 10. The sacrificial layer 6 can be removed, for example, by an etching process, especially by a plasma etching process. For example, the sacrificial layer is formed from silicon. The sacrificial layer can have a vertical layer thickness of 500 nm+/−300 nm. The intermediate carrier 90 can be made of silicon with a layer thickness of a few micrometers or a few hundred micrometers. For example, a rear side 102 of the component assembly 100 is formed by a surface of the intermediate carrier 90. In FIG. 2A, there is an interlayer 91 between the intermediate carrier 90 and the sacrificial layer 6. For example, the interlayer 91 is formed from an oxide material, such as silicon dioxide. The interlayer may have a thickness of about 200 nm. The interlayer 91 serves in particular as an etch stop layer.

The component 10 is delimited in lateral directions by the separation trenches 1T (FIG. 2B). The separation trenches 1T can extend throughout the insulating layer 2. In the separation trenches 1T, the sacrificial layer 6 may be partially exposed. To remove the sacrificial layer 6, an etchant can be guided into the separation trenches 1T. In FIGS. 2A and 2B, the anchoring elements 3, formed as anchoring tethers 3A, can bridge the separation trenches 1T. The anchoring tethers 3A connect the component 10 with an anchor bar 30 or with an anchoring frame 30 which laterally encloses the associated component 10. The anchor bar 30 or anchoring frame 30 for instance adjoins the interlayer 91. After removal of the sacrificial layer 6, a mechanical connection between the component 10 and the intermediate carrier 90 can be achieved solely by the anchoring tethers 3A, the anchor bars 30 or anchoring frame 30, and the interlayer 91. In deviation from FIG. 2A, it is possible that the component assembly 100 has a plurality of further anchoring elements 3 formed as anchoring posts 3B which are arranged in the vertical direction between the component 10 and the intermediate carrier 90 and extend throughout the sacrificial layer 6. The insulating layer 2, the anchoring frame 30, the anchoring tethers 3A and/or the anchoring posts 3B can be formed from the same material or from different materials.

The component 10 has a plurality of contact layers 5, such as a first contact layer 51 and a second contact layer 52. The first contact layer 51 and the second contact layer 52 are in particular assigned to different electrical polarities of the component 10. In particular, a rear side 12 of the component 10 is formed in places by surfaces of the contact layers 5. The rear side 12 of the component 10 can be formed in places by surfaces of the insulating layer 2. Via the first contact layer 51 and the second contact layer 52 on the rear side 12, the rear side of the component 10 can be externally electrically connected.

In FIG. 2A, the electrical device 1 is attached to contact layer 5, for example to the second contact layer 52, by an adhesive layer 15, in particular by an electrically conductive adhesive layer such as a solder layer. In a plan view, the electrical device 1, which can be a light-emitting semiconductor chip or an LED, can be covered, in particular completely covered, by a cover layer 14. The cover layer 14 is, for example, a transparent electrically conductive oxide layer. The electrical device 1 can be electrically connected to the first contact layer 51 via a conductor track 4, which extends for instance from a contact layer 5, for instance from the first contact layer 51 throughout the insulating layer 2 to the cover layer 14 on the front side 11 of the component 10. The conductor track 4 or the first conductor track 41 has a through-via 40 which is located for instance in an opening of the insulating layer 2. The through-via 40 extends in particular throughout the insulating layer 2. The opening of the insulating layer 2 can be partially filled by a filling layer 20. The filling layer 20 can be electrically insulating or electrically conductive.

The component 10 has a vertical layer thickness H10 which is essentially defined by a vertical layer thickness H2 of the insulating layer 2. In particular, at least 80%, 90%, 95% or 98% of the total height H10 of the component 10 may be accounted for by the vertical layer thickness H2 of the insulating layer 2.

FIG. 2B shows several connection pads 8 on the front side 11 of the component 10. For example, each semiconductor optoelectronic chip 1A is assigned to a first connection pad 81, and vice versa. Each of the optoelectronic semiconductor chips 1A may have a cover layer 14, wherein the cover layers 14 of different optoelectronic semiconductor chips 1A is electrically insulated from each other and each of which is electrically connected to one of the first connection pads 81 via a first conductor track 41. The optoelectronic semiconductor chips 1A may have a common second connection pad 82 on the front side 11 of the component 10. The electrical devices 1 shown in FIGS. 2A and 2B, in particular the optoelectronic semiconductor chips 1A, can be externally electrically connectable for instance via their front side and rear side. In other words, such optoelectronic semiconductor chips 1A may have one electrical contact on the front side and another electrical contact on the rear side. As shown in FIG. 2B, the contacts of the device 1 facing the contact layers 5 can be electrically connected to each other via the second contact layer 52 or via further conductor tracks on the rear side 12 of the component 10.

The exemplary embodiment shown in FIG. 2C is essentially the same as the exemplary embodiment shown in FIG. 2A. In contrast, the anchoring tethers 3A are electrically conductive. The anchoring tethers 3A can be part of the electrical conductor tracks 4, 41 and 42. The anchoring tethers 3A directly on the rear side 12 of the component 10 can be in electrical contact with the second contact layer 52. The anchoring tethers 3A directly on the front side 11 of the component 10 are electrically connected to both the cover layer 14 and the first contact layer 51 via the first electrical conductor tracks 41.

The connection pads 8, 81 and 82 can each be arranged sidewards to the component 10 and electrically connected to the associated electrical device 1 or to the associated electrical devices 1 via the conductor tracks 41 and 42. The front side 11 of the component 10 can be free of such connection pads 8, so that the component 10 can be made particularly small and cost-effective. In FIG. 2C, the conductor tracks 41 and 42 or the anchoring tethers 3A can protrude laterally beyond the side faces of the component 10. A cross-matrix circuit, for example for testing component 10, can thus be achieved in a simplified manner. In particular, the second electrical conductor track 42 directly adjoins the sacrificial layer 6 and the interlayer 91. The interlayer 91 serves in particular as an etch stop layer when removing the sacrificial layer 6. In a plan view of the front side 101, the component 10, in particular each of the components 10, can completely overlap with the sacrificial layer 6.

The exemplary embodiment shown in FIG. 2D essentially corresponds to the exemplary embodiment shown in FIG. 2C. In contrast, in particular all anchoring tethers 3A are located on the front side 11 of the component 10. The anchoring tethers 3A can be electrically connected to the first contact layer 51 or to the second contact layer 52 via the through-vias 40 of the first and second conductor tracks 41 and 42. The first connection pad 81 and the second connection pad 82 are each located on the side of the device 10 and can be electrically connected to the electrical devices 1 or 1A via the anchoring tethers 3A.

The exemplary embodiment shown in FIG. 2E is essentially the same as the exemplary embodiments shown in FIGS. 2A, 2C and 2D. In contrast, FIG. 2E shows another electrical device 1B which may be an integrated circuit (IC) chip. The further electrical device 1B is electrically connected to the optoelectronic semiconductor chip 1A via a third conductor track 43. The IC chips 1B can have a greater overall height than the optoelectronic semiconductor chips 1A which can be LEDs. It is therefore preferred to form the insulating layer 2 on two or more levels. In FIG. 2E, the insulating layer 2 has a first sublayer 21 and a second sublayer 22. While the side faces of the device 1A are already completely covered by the second insulating layer 22, the side faces of the device 1B are completely covered only by the first sublayer 21 and the second sublayer 22.

The electrical conductor tracks 4 can have through-vias 40, which extend throughout all sublayers, throughout exactly two sublayers or throughout exactly one sublayer of the insulating layer 2. It is possible that inner contact layers 5 are formed between the sublayers of the insulating layer 2. The anchoring elements 3, in particular the anchoring tethers 3A, may have a vertical height which is as great as a vertical height of one of the sublayers 21 and 22 or as great as the sum of all sublayers of the insulating layer 2.

In FIG. 2E, the outer contact layers 5, 51 and 52 are located directly on the rear side 12 of the component 10 and after removal of the sacrificial layer 6, are freely accessible. The device 1B is located for instance on a contact layer 5. It is possible that the device 1B is electrically contactable only on the front side 11 of the component 10. The device 1A is arranged on an inner contact layer 5. The device 1B has a vertical height that can be at least 50%, 100% or 200% greater than a vertical height of the device 1A. For example, the height of the device 1B is between 2 μm and 10 μm inclusive or between 4 μm and 8 μm inclusive.

The exemplary embodiment shown in FIG. 2F is essentially the same as the exemplary embodiment shown in FIG. 2E. In contrast, the insulating layer 2 has a first sublayer 21, a second sublayer 22 and a third sublayer 23. The device 1B is arranged on the first sublayer 21 and is completely enclosed laterally by the second sublayer 22 and the third sublayer 23. The device 1A is completely enclosed laterally solely by the third sublayer 23. In particular, the device 1A is a surface-mountable device which can be electrically connected only via its rear side facing the intermediate carrier 90. The device 1B can be electrically contacted only via its front side facing away from the intermediate carrier 90. Since the device 1B is arranged on the first sublayer 21, the outer first contact layer 51 and the outer second contact layer 52 on the rear side 12 of the component 10 can be made larger. A lateral distance between the first contact layer 51 and the second contact layer 52 on the rear side 12 can also be formed sufficiently large to avoid an electrical short circuit. This makes it easier to mount the component 10 for instance on a target mounting surface.

The exemplary embodiment shown in FIG. 2G essentially corresponds to the exemplary embodiment shown in FIG. 2F. In contrast, the insulating layer 2 is of a single-layer design. Both device 1A and device 1B are surface-mountable devices. The device 1A and the device 1B can be arranged in places on a common contact layer 50. In contrast to the exemplary embodiments shown in FIGS. 2A to 2F, wherein the contact layers 5 and the electrical conductor tracks 4 are formed on two or three different vertical metallization levels, the contact layers 5 and/or the conductor tracks 4 can be formed on a single metallization plane.

According to FIG. 2G, the device 1A, which may be an optoelectronic semiconductor chip, may be flush with the insulating layer 2 on the front side 11 of the component 10. In particular, the front side 11 is a radiation-emitting surface of the device 1A or of the component 10. In FIG. 2G, the device 1B on the front side 11 protrudes beyond the insulating layer 2. In variation from this, all devices 1, 1A and 1B in FIG. 2H can be flush with the insulating layer 2 at the front side 11. By way of derogation, in a plan view of the front side 11, it is possible that the device 1B, which may be an IC chip, is covered, in particular completely covered, by the insulating layer 2. According to FIGS. 2G and 2H, in each case, the devices 1, 1A and 1B can be formed as so-called flip-chips.

The exemplary embodiment shown in FIG. 2I essentially corresponds to the exemplary embodiment shown in FIG. 2H. In contrast to this, two anchoring tethers 3A can be arranged one above the other, of which one anchoring tether 3A is electrically insulating and the other anchoring tether 3A is electrically conductive. The 3A anchoring tethers can thus be electrically insulating in some areas and electrically conductive in other areas. For example, an electrically conductive area of an anchoring tether 3A is formed by a conductor track 4 or 41. The electrical conductor track 4 or 41 can be directly adjacent to an electrically insulating area of the anchoring tether 3A.

The exemplary embodiment shown in FIG. 2J is essentially the same as the exemplary embodiment shown in FIG. 2I. In contrast, the insulating layer 2 is multi-layered. The electrical devices 1, in particular all optoelectronic semiconductor chips 1A, are arranged on the first sublayer 21 of the insulating layer 2, in particular on the respective inner contact layers 5, and are laterally enclosed by the second sublayer 22. The outer contact layers 51 and 52 are located on the rear side 12 of the component 10 and are electrically connected to the inner contact layers 5 via the through-vias 40 of the electrical conductor tracks 4, 41 and 42. The through-vias 40 extend throughout the first sublayer 21. The contact layers 5 and the conductor tracks 4 are arranged on two different metallization levels as shown in FIG. 2J, for example on a front side and on a rear side of the first sublayer 21.

FIG. 2J shows a combination of electrically insulating and electrically conductive anchoring tethers 3A. The electrically conductive anchoring tethers 3A may be formed in places directly on the rear side 12 and in places between the sublayers 21 and 22 of the insulating layer 2. The electrically conductive anchoring tethers 3A may cover a partial area of the side surfaces of the component 10. In particular, such anchoring tethers 3A are metallic and may be produced by a coating process, such as a deposition process. Such processes may result in minor metal deposits on the side surfaces or on the edges of the component 10. Here, the anchoring tethers 3A can tear more easily when the component 10 is removed.

In all exemplary embodiments, the contact layers 5, the conductor tracks 4, the insulating layer 2 and/or the interlayer 91 can be formed by a coating process, for example by a deposition process such as chemical vapor deposition (CVD) or physical vapor deposition (PVD), for example by sputtering and cathode sputtering.

The exemplary embodiment shown in FIG. 2K essentially corresponds to the exemplary embodiment shown in FIG. 2J. In contrast, the component has no anchoring tethers 3A. Anchoring posts 3B are formed between the component 10 and the intermediate carrier 90 as anchoring elements 3. The anchoring posts 3B extend in particular throughout the sacrificial layer 6. The anchoring posts 3B provide mechanical contact between the component 10 and the intermediate carrier 90 or between the component 10 and the interlayer 91. The anchoring posts 3B may be adjacent, in particular directly adjacent to the outer contact layers 51 or 52. The anchoring posts 3B may be electrically insulating. It is possible that the anchoring posts 3B are vertical elevations of the interlayer 91. Unlike FIG. 2J, the component 10 shown in FIG. 2K may have electrical connection pads 8, 81 and 82 on the front side 11. The devices 1, 1A and 1B can be tested via the conductor tracks 4, 41 and 42 having the through-vias 40, for example by placing probe needles on the connection pads 8.

The exemplary embodiment shown in FIG. 2L is essentially the same as the exemplary embodiment shown in FIG. 2K. In contrast, the anchoring posts 3B are electrically conductive. The anchoring posts 3B can be made of the same material as the conductor tracks 4 or the contact layers 5. In a plan view of the front side 11, the anchoring posts 3B, in particular all anchoring posts 3B, are completely covered by the insulating layer 2 and/or by the electrical devices 1.

After removal of the sacrificial layer 6, mechanical contact between the component 10 and the intermediate carrier 9 or the interlayer 91 may be made exclusively by the anchoring posts 3B. This is shown schematically in FIG. 2M, for example.

According to FIG. 2M, there is a cavity 6S between the component 10 and the interlayer 91 or the intermediate carrier 90. The cavity 6S is in particular a space exposed by removing the sacrificial layer 6. The cavity 6S may be directly adjacent to the cavities 2S in the areas of the separation trenches 1T. The vertical height of the anchoring posts 3B substantially corresponds to the vertical height of the sacrificial layer 6 and may be between 50 nm and 2 μm inclusive, for example between 500 nm and 2 μm inclusive. In particular, the anchoring posts 3B have a vertical height less than 1 μm. When component 10 is removed, the anchoring posts 3B can be mechanically broken, torn off or detached from the interlayer 91 or from the intermediate carrier 90. The small vertical elevation of the anchoring posts 3B can be easily compensated by solder or can be pressed into the target mounting surface. In particular, after decoupling from the intermediate carrier 90, the rear side 12 of the component 10 is free of vertical elevations greater than 2 μm, 1 μm or greater than 500 nm.

The exemplary embodiment shown in FIG. 2N essentially corresponds to the exemplary embodiment shown in FIG. 2M. Deviating from this example, a further conductor track 44, for example the additional one, for example the fourth conductor track 44, is embedded within the interlayer 91. Further conductor tracks 4 and 43 having the through-vias 40 and the anchoring posts 3B can be used to electrically connect the contact layers 5, 51 and 52 to conductor track 44 on the rear side 12 of the component 10. The conductor track 44 can be guided to connection pads 8, 81 and 82 outside of the component 10. The component 10 can thus be formed free of connection pads 8, 81 and 82, for instance on the front side 11.

The component assembly 100 shown in FIG. 2N can be formed free of anchoring tethers 3A. The electrically conductive anchoring posts 3B are electrically connected in particular to the conductor tracks 4 of a cross-matrix circuit. The contact layers 5 can be formed directly on the interlayer 91 and on the sacrificial layer 6. The anchoring posts 3B extend throughout the sacrificial layer 6 between the contact layers 5. It is desirable that the anchoring posts 3B, which are in particular metallic, should break off reliably when component 10 is removed. This can be achieved, for example, by a small cross-section of the anchoring posts 3B or by targeted weakening of the anchoring posts 3B between the contact layers 5. The weakening can already be carried out when applying the material, for example a metal, of the anchoring posts 3B. For example, metals that adhere poorly to each other are coated on top of each other, for example Au on Fe or vice versa. In this case, the anchoring posts 3B and the contact layers 5 can be made of different materials, especially of different metals. It is also possible that the anchoring posts 3B made of Fe or Al, for example, which are oxidized after removal of the sacrificial layer 6.

The exemplary embodiment shown in FIG. 2O essentially corresponds to the exemplary embodiment shown in FIG. 2A. In contrast, the insulating layer 2 is multi-layered. The insulating layer 2 has a first sublayer 21 and a second sublayer 22. The anchoring tethers 3A are formed exclusively on the vertical plane of the second sublayer 22. The anchoring tethers 3A can be formed by structuring the second sublayer 22. There may be cavities 2S below the anchoring tethers 3A in the first sublayer 21. The first sublayer 21 has openings, in which the conductor tracks 4, 41 and 42 having the associated through-vias 40 are formed. The electrical devices 1, in particular all optoelectronic semiconductor chips 1A, are arranged on the first sublayer 21. The external contact layers 51 and 52 on the rear side 12 are configured for instance for the external electrical contacting of the component 10, wherein a lateral distance between the first contact layer 51 and the second contact layer 52 can be kept sufficiently large.

The exemplary embodiment shown in FIG. 3A essentially corresponds to the exemplary embodiment shown in FIG. 1A. The difference is that the anchoring tethers 3A, in particular all anchoring tethers 3A, are electrically conductive. In particular, the anchoring tethers 3A are parts of the electrical conductor tracks 4, 41 and 42 which protrude laterally beyond the side surfaces of the component 10.

For example, a component 10 shown in FIG. 3A or a component assembly 100 shown in FIG. 3A is illustrated in FIG. 3B in top view. Each component 10 can be surrounded by an anchoring frame 30. The anchoring frame 30 and the insulating layer 2 can be made of the same material. Additional connection pads 8 and 81 are shown in FIG. 3B. In contrast to FIG. 3B, the component 10 may be free of such connection pads 8 on the front side 11 of the component 10. In this case, all connection pads 8, 81 and 82 are located sidewards to the component 10, especially on the front side 101 of the component assembly 100. The contacts, especially the lower contacts of the device 1, can be connected to each other by the conductor tracks 4, 41 or 42. The components 10 can be tested in a cross-matrix circuit.

Even in a cross-matrix circuit, if the connection pads 8 and 81 are furthermore present on the front side 11, single components 10, especially single electrical devices 1, can be probed individually. This is shown schematically in FIG. 3C, for example. The current injection into the individual component 10 or into the individual electrical device 1 can be performed by a pair or by several test needles 80.

The component assembly 100 shown in FIGS. 2A to 3C can be produced by an additive process. All layers and devices on the intermediate carrier 90 can be applied onto the intermediate carrier 90 from above. For example, the interlayer 91, the sacrificial layer 6, the electrical devices 1 and the insulating layer 2 are applied onto the intermediate carrier 90 in the order given. The contact layers 5 and/or the electrical conductor tracks 4 are formed in particular in the presence of the intermediate carrier 90.

In particular, each component 10 is free of a further mechanically stabilizing layer which is different from the insulating layer 2 and arranged for instance between the electrical devices 1 and the sacrificial layer 6 or the intermediate carrier 90. The component 10 is mechanically stabilized in particular mainly by the insulating layer 2. A component 10 of this type can therefore be made particularly thin. For example, the total vertical layer thickness H2 of the insulating layer 2 is at most 4 µm, 5 µm, 8 µm, 10 µm or at most 30 µm. The intermediate carrier 90 has a vertical height which can be greater than 100 µm. The interlayer 91 has a vertical height which is about 200 nm thick. For example, the interlayer is an oxide layer, especially a silicon oxide layer. The sacrificial layer 6 has a vertical height which is, for example, at least two, three or four times greater than the vertical height of the interlayer 91.

The sacrificial layer 6 is preferably formed of silicon. The contact layers 5, in particular the outer contact layers 5, can be a layer comprising titanium and/or gold. The contact layer 5 can have a vertical height of about 50 nm. It is possible that the contact layers 5 and the electrical conductor tracks 4 are formed from the same material, for example a metal. The insulating layer 2 with its sublayers 21, 22 and 23 can be formed from an oxide material such as SiO2 or from a nitride material such as silicon nitride. The insulating layer 2 can be formed by a vapor phase deposition process or by a sputtering process. For example, each of the sublayers 21, 22 and 23 may have a vertical layer thickness of less than 5 µm, 3 µm, 2 µm or less than 1 µm.

FIG. 4A shows another exemplary embodiment of a component assembly or of a component 10 in a plan view of the rear side 12 of the component 10. In particular, the contact layers 5, 51 and 52 are freely accessible on the rear side 12. The component 10 is anchored to the intermediate carrier 90 (not shown in FIG. 4A) by a plurality of anchoring elements 3 which can be formed as anchoring tethers 3A or anchoring posts 3B. As shown in FIG. 4A, each component 10 has four different anchoring tethers 3A. In particular, in addition or alternatively, the component 10 is fixed to the intermediate carrier 90 by a plurality of anchoring posts 3B, for example, by four anchoring posts 3B on the rear side 12, particularly in the areas of the contact layers 5 or of the electrical devices 1. The anchoring tethers 3A may also be located on only one side surface of the component 10 (FIG. 4). In particular, component 10 has a single anchoring tether 3A as shown in FIG. 4B. However, the size and number of anchoring elements 1 can be variable. FIG. 4B shows the component 10 or the component assembly 100 in a plan view of the front side 11 or 101. The electrical devices 1 can be electrically connected to the contact layers 5, 51 and 52 on the rear side 12 of the component 10 via the conductor tracks 4 and the through-vias 40.

FIGS. 4C and 5A schematically show an example of a component assembly 100 and of a component 10 in top view and in sectional view along the sectional plane ABC. The exemplary embodiment shown in FIG. 5A essentially corresponds to the exemplary embodiment shown in FIG. 2D. In contrast to this, the anchoring tethers 3A each have two layers. The anchoring tether 3A has an electrically insulating area which, in a plan view of the front side 11, is covered by an electrically conductive area.

In a further difference, the component assembly 100 has a carrier assembly 9V which is arranged in the vertical direction between the intermediate carrier 90 and the insulating layer 2. The carrier assembly 9V is formed in particular from a semiconductor material, such as silicon. The carrier assembly 9V has a vertical height H9 which is in particular greater than the vertical height H2 of the insulating layer 2. For example, a ratio of the height H9 to the height H2 is at least two, five, eight or at least 10. For example, the height H9 is between 3 µm and 100 µm inclusive or between 5 µm and 50 µm inclusive. In virtue of the separation trenches 1T, which extend in particular throughout the carrier assembly 9C, the carrier assembly 9V can be divided into a plurality of carriers 9 of the components 10. The carrier assembly 9V or the carrier 9 can be surrounded by a protective layer 7, in particular completely surrounded except for the separation trenches 1T. The protective layer 7 can be an oxide layer, for example a silicon oxide layer.

According to FIG. 5A, the carrier assembly 9V or the carrier 9 has a plurality of openings, in which the through-vias 40 are located. The through-via 40 extends in particular from an outer contact layer 51 or 52 throughout the opening of the carrier 9 to an inner contact layer 5 which is located for instance between the insulating layer 2 and the carrier 9. The device 1 can be arranged on one of the inner contact layers 5.

The carrier assembly 9V is mechanically connected to the intermediate carrier 90, in particular by a connecting layer 9C. The sacrificial layer 6 is located in particular on the rear side 12 of the component 10. The sacrificial layer 6 can be directly adjacent to the connecting layer 9C. According to FIG. 5A, the sacrificial layer 6 and the connecting layer 9 are located in places inside the openings of the carrier assembly 9C or of the carrier 9. The connecting layer 9C may be an adhesion promoting layer or an adhesive layer. For example, the connecting layer 9C comprises benzocyclobutene (BCB) or BCB-based polymers. The carrier assembly 9V can be bonded to the intermediate carrier 90 using a wafer bonding process.

The exemplary embodiment shown in FIG. 5B essentially corresponds to the exemplary embodiment shown in FIG. 5A. In contrast, the component assembly 100 has, in addition to the anchoring tethers 3A, a plurality of anchoring posts 3B, which are arranged in the vertical direction between the carrier assembly 9V and the intermediate carrier 90. The anchoring posts 3B extend throughout the sacrificial layer 6 to the rear side 12 of the component 10. The anchoring posts 3B and the connecting layer 9C can be made of the same material or of different materials. In further contrast to FIG. 5B, the electrically conductive anchoring tethers 3A may be located between the insulating layer 2 and the carrier 9.

At the rear side 12 of the component 10, the connecting layer 9C may imitate a topography of the carrier assembly 9V and may be located in particular in places in the openings of the carrier assembly 9V or of the carrier 9. The openings of the carrier assembly 9V can be cylindrical, conical, truncated conical, in places concave or in places convex. According to FIG. 5B, the openings of the carrier assembly 9V or of the carrier 9 have a cross-section that decreases with increasing distance from the insulating layer 2. The openings can each have a maximum lateral expansion of between 5 μm and 25 μm.

It is possible that the electrically insulating anchoring tethers 3A and the insulating layer 2 are made from the same material, for example from a dielectric such as silicon dioxide. At the edges of the component 10, the insulating layer 2 can be tapered or structured in such a way that a anchoring tether 3A for anchoring the component 10 is formed, which is and remains connected to the intermediate carrier 90. If the component 10 is released, for example during a chip transfer process, the anchoring tether 3A is broken or detached.

Alternatively or additionally, further anchoring elements 3, such as the anchoring posts 3B, can be located on the rear side 12 of the component. These anchoring posts 3B are still connected to the connecting layer 9C or to the intermediate carrier 90 removing the sacrificial layer 6, for example, by an etching process. During a transfer process of the component 10 for instance to a target mounting surface, the anchoring posts 3B are detached or torn off from the component 10 or from the carrier 9. The anchoring posts 3B can be produced in a simplified manner by forming openings in the sacrificial layer 6 which are then refilled with a material other than that of the sacrificial layer 6. Compared with the anchoring tethers 3A, the anchoring posts 3B have the advantage of requiring less space because they are not located on the side but underneath the components 10.

The exemplary embodiment shown in FIG. 5C essentially corresponds to the exemplary embodiment shown in FIG. 5B. The difference is that insulating layer 2 is double-layered. With the exception of the carrier assembly 9V, the protective layer 7 and of the connecting layer 9C, the exemplary embodiment shown in FIG. 5C corresponds to the exemplary embodiment shown in FIG. 2E. According to FIG. 5C, cavities 2S may be formed in areas of the separation trenches between the carriers 9 of adjacent components 10.

Similar to FIG. 5C, the exemplary embodiment shown in FIG. 5D essentially corresponds to the exemplary embodiment shown of a component assembly 100 in FIG. 2H, but with the carrier assembly 9V.

The exemplary embodiment shown in FIG. 5E essentially corresponds to the exemplary embodiment shown in FIG. 5D. In contrast, the electrical device 1B is not laterally enclosed by the insulating layer 2. The electrical device 1B, which can be an IC chip, can be integrated in a wiring level 1V. In particular, the wiring level 1V is located between the carrier 9 or the carrier assembly 9V and the insulating layer 2.

The exemplary embodiment shown in FIG. 5F essentially corresponds to the exemplary embodiment shown in FIG. 5E. In FIG. 5E, the wiring level 1V is free of openings. In contrast, the openings shown in FIG. 5F do not only pass through the carrier 9 but also through the wiring level 1V. The through-vias 40 of the conductor tracks 4, 41 or 42 thus extend from the rear side 12 of the component 4 to the contact layers 5, 51 or 52, wherein the contact layers 5 are located between the insulating layer 2 and the wiring level 1V. In FIG. 5E, the conductor tracks 4 having the through-vias 40 extend only as far as the wiring level 1V.

The exemplary embodiment shown in FIG. 5G essentially corresponds to the exemplary embodiment shown in FIG. 5F. In contrast to FIG. 5F, wherein the wiring level 1V is located between the insulating layer 2 and the carrier 9, according to FIG. 5G, the carrier 9 is located between the insulating layer 2 and the wiring level 1V. For the electrical contacting of the wiring level 1V to the circuits integrated therein or to the IC chips 1B embedded therein, further conductor tracks 45 can be arranged between the rear side 12 of the component 10 and the wiring level 1V.

The exemplary embodiment shown in FIG. 5H essentially corresponds to the exemplary embodiment shown in FIG. 5A. In contrast, all anchoring tethers 3A can be electrically insulating. The openings through the carrier 9 can be formed in such a way that their cross-sections decrease with increasing distance to the insulating layer 2. On the rear side 12 of the component 10, solder layers 51L and 52L may be present. A first solder layer 51L may be adjacent to the first contact layer 51. A second layer of solder 52L may be adjacent to the second contact layer 52. Especially, the solder layers 51L and 52L are electrically conductive. In this sense, the contact layers 5, 51 and 52 on the rear side 12 of the component 10 are still freely accessible for the external electrical contacting of the component 10. The outer contact layers 5 and the solder layers 51L and 52L can thus form common contact layers on the rear side 12 of the component 10.

The carrier assembly 9V or the carrier 9 can thus have solder layers 51L and 52L on its underside for mechanical fastening and/or for electrical contacting of the respective component 10 (FIG. 5H). In addition or as an alternative, the carrier assembly 9V or the carrier 9 can have solder layers 15L on its upper side for mechanical fastening and/or electrical contacting of the devices 1, 1A and 1B (FIG. 6A).

FIGS. 6A, 6B and 6C schematically show a few method steps for producing a component assembly 100, wherein the electrical devices 1, 1A and 1B are attached to the inner contact layers 5 for instance by a solder layer 15L.

The exemplary embodiment shown in FIG. 6A essentially corresponds to the exemplary embodiment of a component assembly 100 shown in FIG. 5A, but initially without the insulating layer 2, the anchoring tethers 3A, the cover layer 14 and the electrical conductor tracks 4 located within the insulating layer 2 or on the insulating layer 2. The carrier 9 can be formed such that a solder layer 15L for the mounting of the electrical devices 1, 1A and 1B is located on its surface or on the contact layers 51 and 52. The electrical devices 1 can be optoelectronic semiconductor chips, IC chips and other devices such as sensors or resistors. In particular, the electrical device 1 is formed for surface-mounting and has electrical contacts 15 exclusively on its surface facing the rear side 12 of the component 10.

According to FIG. 6B, the insulating layer 2 is applied onto the carrier 9 or onto the carrier assembly 9V in such a way that the electrical device 1 or the electrical devices 1 is/are completely enclosed laterally by the insulating layer 2. In the regions of the separation trenches 1T, the insulating layer 2 can be structured such that the anchoring tethers 3A are formed.

According to FIG. 6C, the sacrificial layer is removed, for example by an etching process. A cavity 6S is formed between the component 10 and the intermediate carrier 90 in place of the sacrificial layer 6. The cavity 6S can be directly or indirectly adjacent to the cavities 2S in the separation trenches 1T. After removal of the sacrificial layer 6, the component 10 is mechanically connected to the intermediate carrier 90, in particular exclusively by the anchoring elements 3, in this case by the anchoring tethers 3A and the anchoring posts 3B. The component 10 can then be removed from the intermediate carrier 90 in a targeted and safe manner, for example by using an adhering stamp. When the component 10 is removed, the anchoring elements 3 are broken or torn off or detached from the intermediate carrier 90.

FIGS. 7A, 7B, 7C, 7D and 7E schematically illustrate some further method steps of the production of a component assembly 100.

Figure 7A:
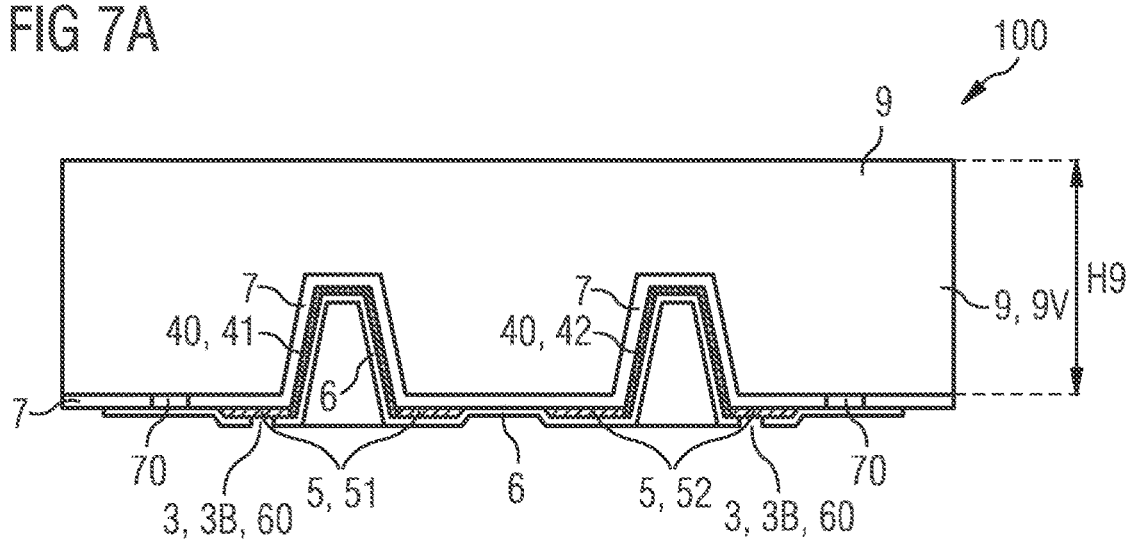

FIG. 7A shows a carrier assembly 9V made of silicon, for example. Recesses, such as blind holes, are formed in the carrier assembly 9V, wherein the electrical conductor tracks 41 and 42 and through-vias 40 are formed in the recesses. The recesses can be etched by a plasma etching process with a predetermined target thickness of the carriers 9 in the carrier assembly 9V. The carrier assembly 9V can be oxidized, for example to form the protective layer 7, structured and metallized, for example to form the conductor tracks 4 and/or contact layers 5. A sacrificial layer 6, for instance a silicon layer, is then applied to the conductor tracks 4, 40, 41 and 42 and/or to the protective layer 7. Optionally, it is possible that the protective layer 7 also has openings 70. To form the anchoring posts 3B, openings 60 can be formed in the sacrificial layer 6.

Figure 7B:
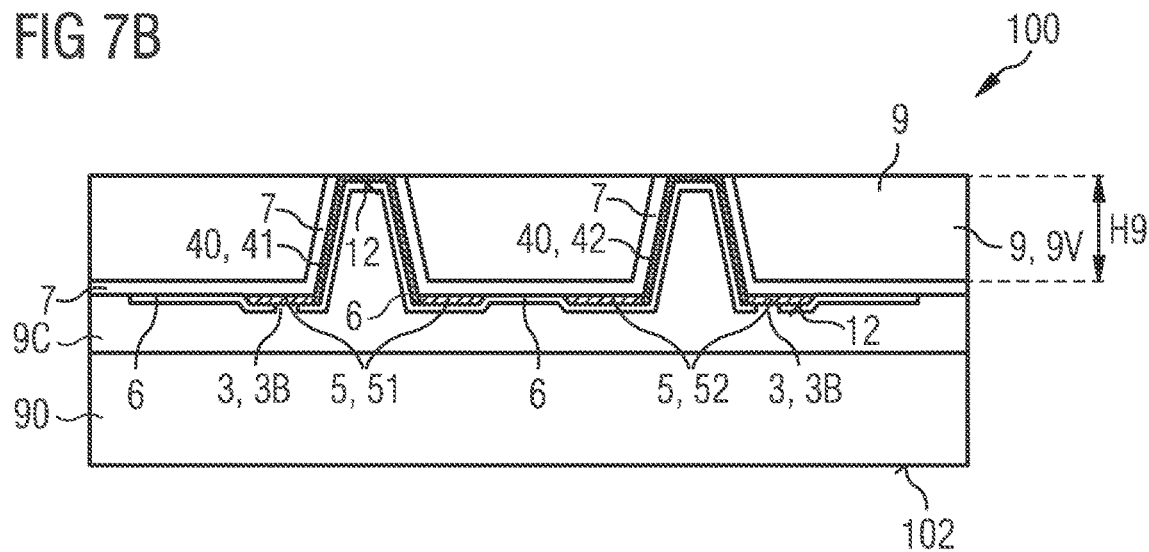

As shown in FIG. 7B, for example, the carrier assembly 9V is mounted and fixed to the intermediate carrier 90 by a wafer bonding process. Benzocyclobutene (BCB) or a BCB-based polymer can be used as an adhesive. The carrier assembly 9V can then be thinned to a predetermined target thickness. The recesses are now used to form openings in the 9V carrier assembly which extend throughout the 9V carrier assembly.

Figure 7C:
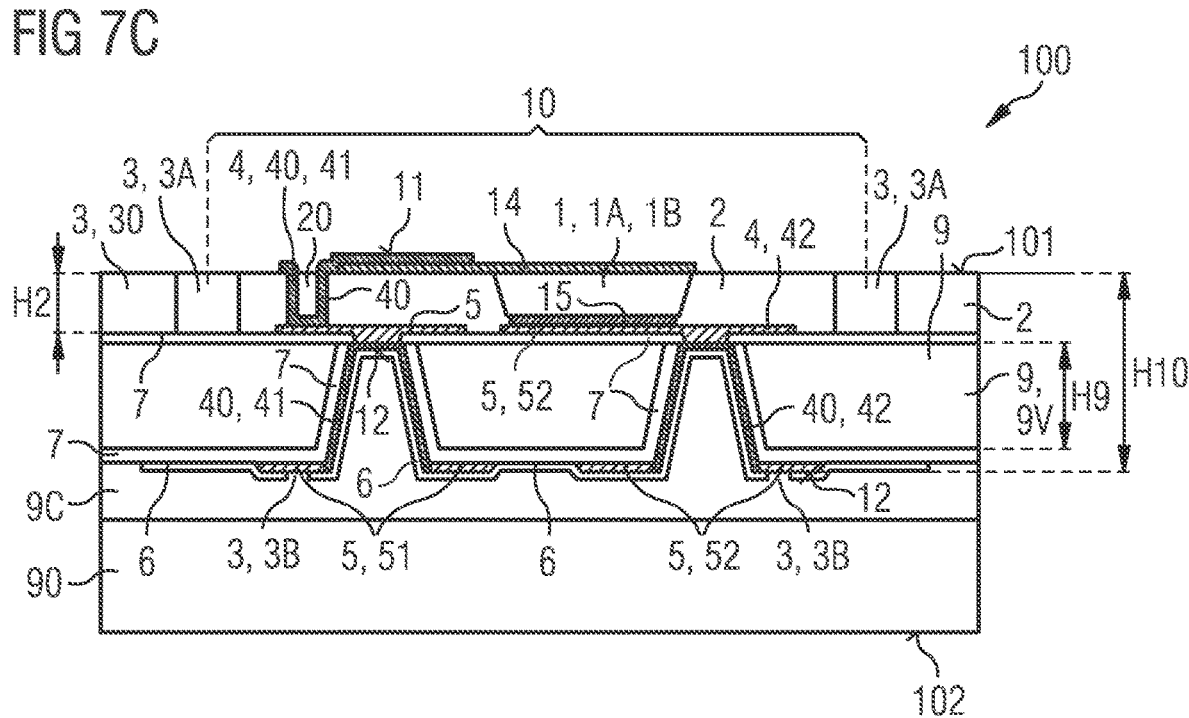

As shown in FIG. 7C, the protective layer 7, such as an oxide layer, can be formed on the surface of the carrier assembly 9V facing away from the intermediate carrier 90. For example, an oxide layer, such as a silicon oxide layer, is deposited and structured. Separation trenches 1T are formed, which divide the carrier assembly 9V into a plurality of carriers 9. The separation trenches 1T of the carrier assembly 9C can be formed by plasma etching, for example by a self-passivating plasma etching process, the so-called Bosch process. In particular, after the etching process, the etching edges of the separation trenches 1T are still covered by a passivation layer, for instance by a fluoropolymer, so that the carrier assembly 9V is not etched along with the opening of the protective layer 7 and/or the sacrificial layer 6 or with the removal of the sacrificial layer 6.

It is possible that the carrier assembly 9V is a SOI (Silicon-on-Insulator) wafer. In this case, a precisely pre-defined depth of the recesses or blind holes can be set by an insulating layer embedded in the SOI wafer, for example by an oxide layer buried in it. In particular, the blind holes end exactly at such an insulating layer. By wet chemical removal of parts of the carrier assembly 9V and/or of the insulating layer, a structure as shown in FIG. 7B can also be formed, but with less risk to the integrity of existing insulation sleeves.

Figure 7D:
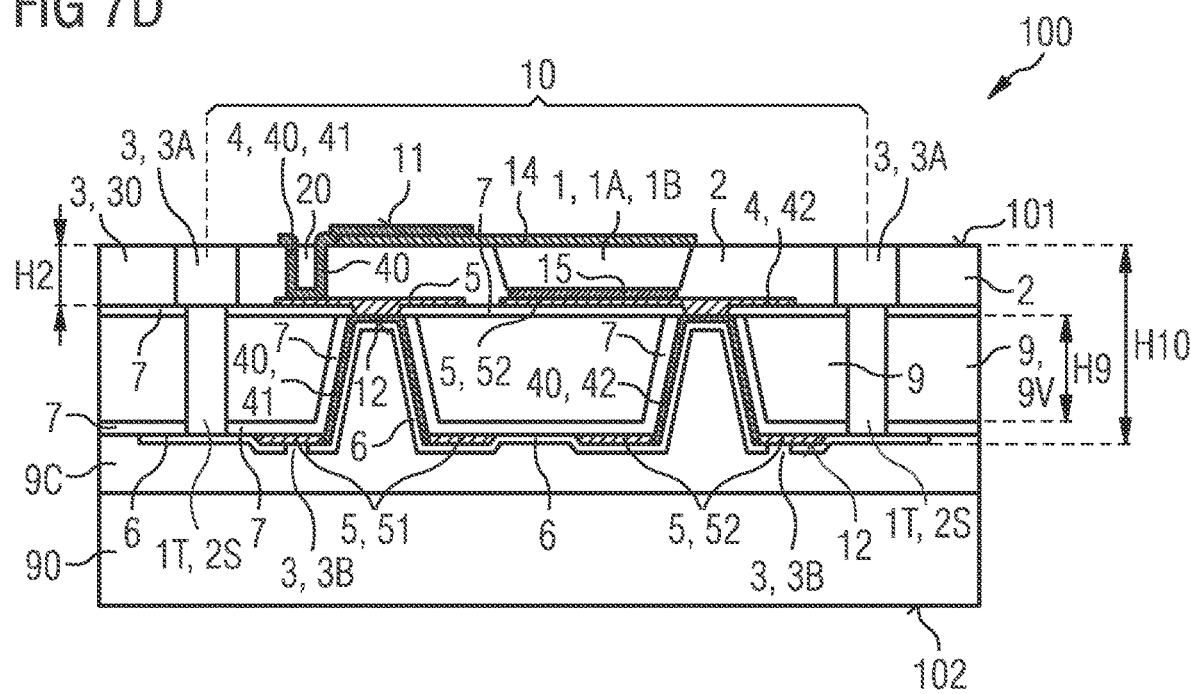

The electrical devices 1, 1A and 1B can be applied to the carrier assembly 9V and wired by means of the electrical conductor tracks 4, 40, 41 and 42. The insulating layer 2 is formed on the carrier assembly 9V. It is possible that the insulating layer 2 is structured in places to form anchoring elements 3, in particular anchoring tethers 3A. The formation of separation trenches 1T can be carried out before or after the formation of the insulating layer 2 (FIG. 7D).

Figure 7E:
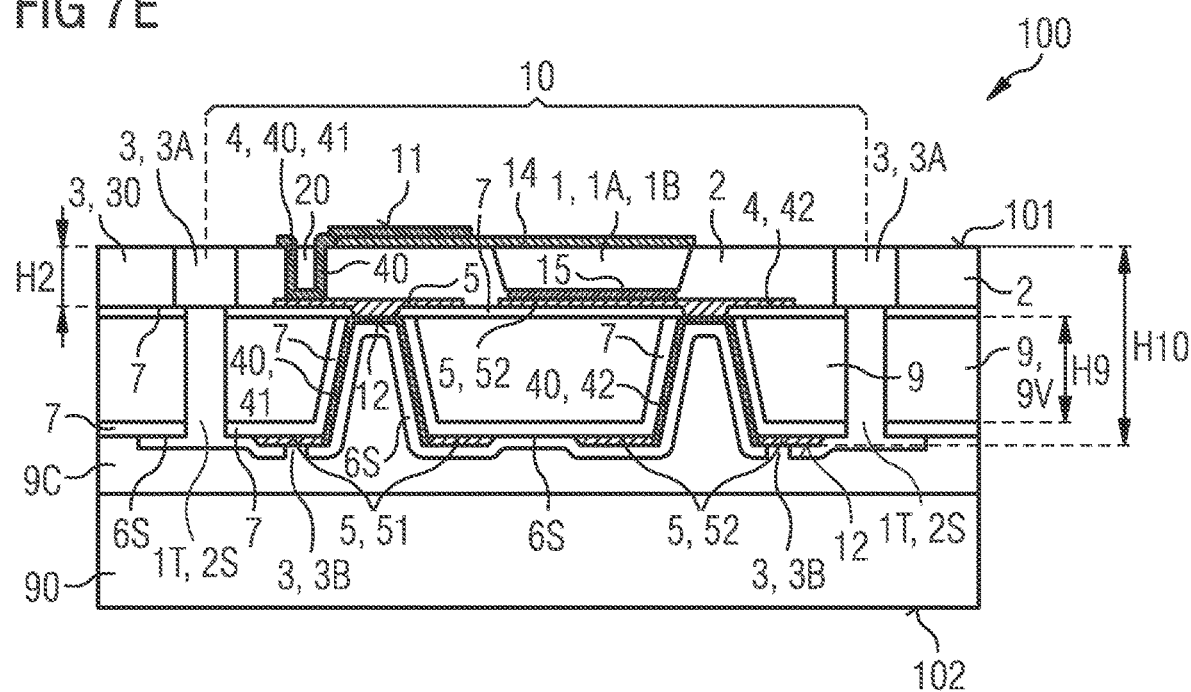

The sacrificial layer 6 is removed as shown in FIG. 7E. This can be done, for example, by guiding an etchant into the regions of the separation trenches 1T. Alternatively, it is possible to open the protective layer 7 in regions, for example by an oxide etching process. An etchant can then be added to the sacrificial layer 6, after which the sacrificial layer 6 is removed.

As shown in FIG. 8A, recesses are formed in the carrier assembly 9V. The protective layer 7 is formed first, after which the electrical conductor tracks 4, 40, 41 and 42 are formed on the protective layer 7. Inside the recesses, the protective layer 7 can be located between the carrier assembly 9V and the electrical conductor tracks 4. The protective layer 7 and the electrical conductor tracks 4 extend in places into the recesses of the carrier assembly 9V. For forming the openings throughout the carrier assembly 9V, the carrier assembly 9V is thinned such that the protective layer 7 or the electrical conductor tracks 4, 41 and 42 are exposed in places. The through-vias 40 extend for instance from a contact layer 5, 51 or 52 on one surface of the carrier assembly 9 throughout the opening to another surface of the carrier assembly 9V.

Alternatively, as shown in FIG. 8B, it is possible to form gaps in the carrier assembly 9V instead of recesses. In particular, the gaps are formed in such a way that they surround a cylindrical or conical section of the carrier assembly 9V. The gaps can be filled with a dielectric, for example by a spin-on process, a chemical vapor deposition process, i.e. a CVD process, or by an atomic layer deposition process, i.e. an ALD process. The region of the carrier assembly 9V surrounded by the dielectric can form a direct current path throughout the carrier assembly 9V, especially after the carrier assembly 9V has been thinned (analogous to the method steps shown in FIGS. 7A and 7B).

FIGS. 9A, 9B, 9C and 9D schematically illustrate various process flows for the production of a component assembly 100, in particular having a carrier assembly 9V or the carriers 9. During step P1, no chip placement takes place yet. Only in step P2, the electrical devices 1, 1A and 1B are attached to the carriers 9 or to the intermediate carrier 90. The process flow in FIG. 9A comprises the method steps shown in FIGS. 7A, 7B and 7C. The formation of the first solder layer 51L and the second solder layer 52L on the rear side 12 of the component 10 is carried out in particular before chip placement. This could lead to a slight limitation of the process temperatures in the subsequent processes, as otherwise the solder quality would deteriorate.

As shown in FIG. 9B, the solder layers 51L and 52L are only formed after the chip placement on the rear side 12 of the component 10. This process sequence, however, requires the use of an auxiliary carrier 9H which is removed only after the carrier assembly 9V has been attached to the intermediate carrier 90. Before the removal of the auxiliary carrier 9H, the electrical devices 1, 1A, 1B or the components 10 can be arranged between the auxiliary carrier 9H and the intermediate carrier 90.

The step P1 as shown in FIG. 9C essentially corresponds to the step P1 as shown in FIG. 9A. The difference is that the auxiliary carrier 9H is used instead of intermediate carrier 90. After chip placement, a further auxiliary carrier 9W is used, after which the auxiliary carrier 9H is removed. Before removing the auxiliary carrier 9H, the electrical devices 1, 1A, 1B or the components 10 can be placed between the auxiliary carrier 9H and the further auxiliary carrier 9W. The further auxiliary carrier 9W is then removed after the carrier assembly 9V having the electrical devices 1, 1A and 1B arranged on it is fastened to the intermediate carrier 90. Before the removal of the further auxiliary carrier 9W, the electrical devices 1, 1A, 1B or the components 10 can be arranged between the intermediate carrier 90 and the further auxiliary carrier 9W.

The process flow shown in FIG. 9D is a compromise of the process flows shown in FIGS. 9A and 9B. The order of the method steps according to different process flows can be taken directly from FIGS. 9A, 9B, 9C and 9D. According to FIG. 9D, the solder layers 51L and 52L are formed on the carrier assembly 9V before the chip placement, especially before fixing the carrier assembly 9V on the intermediate carrier 90.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

LIST OF REFERENCE NUMERALS

100 Component assembly
101 Front side of the component assembly
102 Rear side of the component assembly
10 Component
11 Front side of the component
12 Rear side of the component
14 Cover layer
15 Adhesive layer/Contact of the electrical element
15L Solder layer
1 Electrical device
1A Optoelectronic semiconductor chip
1B IC chip/Integrated Circuit
1T Separation trench between the components
1V Wiring level
2 Insulating layer
20 Filling layer
21 First sublayer of the insulating layer
22 Second sublayer of the insulating layer
23 Third sublayer of the insulating layer
2S Cavity between the components
3 Anchoring element
30 Anchoring frame
3A Anchoring tether
3B Anchoring post
4 Conductor track
40 Through-via
41 First conductor track
42 Second conductor track
43 Third conductor track
44 Fourth conductor track
45 Further conductor track
5 Contact layer
50 Common contact layer
51 First contact layer
52 Second contact layer
51L First contact layer/First solder layer
52L Second contact layer/Second solder layer
6 Sacrificial layer
60 Opening of the sacrificial layer
6S Cavity between the intermediate carrier and the components
7 Protective layer
70 Opening of the protective layer
8 Connection pad
80 Test needle
81 First connection pad
82 Second connection pad
9 Carrier of the component
90 Intermediate carrier
91 Interlayer
9V Carrier assembly
9C Connecting layer
9H Auxiliary carrier
9W Further auxiliary carrier
H2 Height of the insulating layer
H9 Height of the carrier of the component
H10 Height of the component
P1 First step/before chip placement
P2 Second step/after chip placement

The invention claimed is:

1. A method for producing a plurality of printable components on a common intermediate carrier, the components each having at least two electrical devices and an insulating layer, wherein at least one of the electrical devices of the component is an optoelectronic semiconductor chip, having the following steps:

providing a plurality of electrical devices;

forming the insulating layer between the electrical devices of the same component, wherein the at least two electrical devices of the same component are arranged next to one another and each are laterally enclosed by the insulating layer, so that the at least two electrical devices and the insulating layer of the same component are formed as integral parts of a self-supporting and mechanically stable unit and form the self-supporting and mechanically stable unit; and forming a plurality of anchoring elements which fix the positions of the components on the intermediate carrier and release them under mechanical load when the components are removed, so that the components formed as self-supporting and mechanically stable units are detachable from the intermediate carrier, wherein the anchoring elements comprise anchoring posts which are arranged in the vertical direction exclusively between the intermediate carrier and the components and are formed to be breakable or detachable under mechanical load when the components are removed, the anchoring elements are located on at least two different vertical levels of the component assembly, the anchoring elements are formed to be electrically conductive at least in places, the components each have at least one connection pad on their front side facing away from the intermediate carrier, wherein the connection pad is configured to receive a test needle for current injection into the component during a quality test of the functionality of one associated component, the components are formed such that their functionality can be tested via a cross-matrix circuit, the cross-matrix circuit comprising in places the anchoring elements which are formed to be electrically conductive, after mechanical decoupling from the intermediate carrier, the components each have a vertical height, wherein at least 90 percent of the vertical height of the component are accounted for by a sum of a vertical layer thickness of the insulating layer and a vertical layer thickness of a carrier of one associated component, and wherein before the decoupling of the component, the carrier is arranged between the intermediate carrier and the electrical devices in the vertical direction, or after mechanical decoupling from the intermediate carrier, the components each have a vertical height, wherein at least 80 percent of the vertical height of the component are accounted for by a vertical layer thickness of the insulating layer and the insulating layer thus serves as the only mechanically stabilizing layer of the respective component.

2. The method according to claim 1,
wherein the components are produced in an additive manner on the single common intermediate carrier, wherein the electrical devices are applied individually onto the intermediate carrier and the electrical devices of the same component are detachable from the intermediate carrier in groups.

3. The method according to claim 1,
wherein a carrier assembly is provided, which is fixed to the intermediate carrier by a connecting layer, wherein the carrier assembly is arranged in the vertical direction between the intermediate carrier and the electrical devices, and wherein the components each have a carrier from the carrier assembly.

4. A component assembly having an intermediate carrier, a plurality of components arranged thereon and a plurality of anchoring elements, wherein
the components each have at least two electrical devices and an insulating layer, at least one of the electrical devices of the component being an optoelectronic semiconductor chip, the insulating layer is arranged in places between the electrical devices of the same component, the at least two electrical devices of the same component being arranged next to one another and each being enclosed laterally by the insulating layer, so that the at least two electrical devices and the insulating layer of the same component are formed as integral parts of a self-supporting and mechanically stable unit and form the self-supporting and mechanically stable unit, the anchoring elements fix the positions of the components on the intermediate carrier, wherein the components formed as self-supporting and mechanically stable units are detachable from the intermediate carrier and the anchoring elements release the components under mechanical load when the latter are removed, and the insulating layer directly adjoins the electrical devices, wherein the insulating layer and the electrical devices are formed as contiguous parts of the component.

5. The component assembly according to claim 4,
wherein each component has at least three electrical devices, wherein the at least three electrical devices are three optoelectronic semiconductor chips, and wherein the three optoelectronic semiconductor chips are a red light-emitting semiconductor chip, a green light-emitting semiconductor chip and a blue light-emitting semiconductor chip.

6. The component assembly according to claim 4,
wherein the anchoring elements comprise anchoring tethers which are formed at least in places sidewards to the components and are formed to be breakable or detachable under mechanical load when the components are removed.

7. The component assembly according to claim 4,
wherein the anchoring elements comprise anchoring posts which are arranged in the vertical direction exclusively between the intermediate carrier and the components and are formed to be breakable or detachable under mechanical load when the components are removed.

8. The component assembly according to claim 4,
wherein the anchoring elements are located on at least two different vertical levels of the component assembly.

9. The component assembly according to claim 4,
wherein the anchoring elements are formed to be electrically insulating.

10. The component assembly according to claim 4,
wherein the anchoring elements are formed to be electrically conductive at least in places.

11. The component assembly according to claim 10,
wherein with regard to their functionality, the components are formed such that they are testable in groups, wherein the components of the same group to be tested are electrically connected to one another via the electrically conductive anchoring elements and thus are formed so that they testable simultaneously.

12. The component assembly according to claim 4,
wherein the components each have at least one connection pad on their front side facing away from the intermediate carrier, wherein the connection pad is configured to receive a test needle for current injection into the component during a quality test of the functionality of one associated component.

13. The component assembly according to claim 4,
wherein the components are formed such that their functionality can be tested via a cross-matrix circuit, the cross-matrix circuit comprising in places the anchoring elements which are formed to be electrically conductive.

14. The component assembly according to claim 4, wherein
the electrical devices are electrically connected to contact layers of one associated component, and the contact layers are configured for external electrical contacting of the components, and the contact layers are arranged between the intermediate carrier and the electrical devices such that the contact layers are freely accessible after the components have been detached from the intermediate carrier.

15. The component assembly according to claim 4,
wherein a removable sacrificial layer is arranged in the vertical direction between the components and the intermediate carrier, wherein the sacrificial layer forms a common boundary between the intermediate carrier and the components, and wherein after removal of the sacrificial layer, the components are held on the intermediate carrier solely by the anchoring elements.

16. The component assembly according to claim 4, wherein a cavity is formed between adjacent components and/or between the components and the intermediate carrier, wherein the anchoring elements directly adjoin the cavity in places.

17. The component assembly according to claim 4, wherein after mechanical decoupling from the intermediate carrier, the components each have a vertical height, wherein at least 90% of the vertical height of the component are accounted for by a sum of a vertical layer thickness of the insulating layer and a vertical layer thickness of a carrier of one associated component, and wherein before the decoupling of the component, the carrier is arranged between the intermediate carrier and the electrical devices in the vertical direction.

18. The component assembly according to claim 4, wherein after mechanical decoupling from the intermediate carrier, the components each have a vertical height, wherein at least 80% of the vertical height of the component are accounted for by a vertical layer thickness of the insulating layer and the insulating layer thus serves as the only mechanically stabilizing layer of the respective component.

19. The component from the component assembly according to claim 4, wherein the component is mechanically decoupled from the intermediate carrier.

20. A component assembly having an intermediate carrier, a plurality of components arranged thereon and a plurality of anchoring elements, wherein
- the components each have at least two electrical devices and an insulating layer, at least one of the electrical devices of the component being an optoelectronic semiconductor chip,
- the insulating layer is arranged in places between the electrical devices of the same component, the at least two electrical devices of the same component being arranged next to one another and each being enclosed laterally by the insulating layer, so that the at least two electrical devices and the insulating layer of the same component are formed as integral parts of a self-supporting and mechanically stable unit and form the self-supporting and mechanically stable unit, and
- the anchoring elements fix the positions of the components on the intermediate carrier, wherein the components formed as self-supporting and mechanically stable units are detachable from the intermediate carrier and the anchoring elements release the components under mechanical load when the latter are removed, wherein
- the anchoring elements comprise anchoring posts which are arranged in the vertical direction exclusively between the intermediate carrier and the components and are formed to be breakable or detachable under mechanical load when the components are removed,
- the anchoring elements are located on at least two different vertical levels of the component assembly,
- the anchoring elements are formed to be electrically conductive at least in places
- the components each have at least one connection pad on their front side facing away from the intermediate carrier, wherein the connection pad is configured to receive a test needle for current injection into the component during a quality test of the functionality of one associated component,
- the components are formed such that their functionality can be tested via a cross-matrix circuit, the cross-matrix circuit comprising in places the anchoring elements which are formed to be electrically conductive,
- after mechanical decoupling from the intermediate carrier, the components each have a vertical height, wherein at least 90 percent of the vertical height of the component are accounted for by a sum of a vertical layer thickness of the insulating layer and a vertical layer thickness of a carrier of one associated component, and wherein before the decoupling of the component, the carrier is arranged between the intermediate carrier and the electrical devices in the vertical direction, or
- after mechanical decoupling from the intermediate carrier, the components each have a vertical height, wherein at least 80 percent of the vertical height of the component are accounted for by a vertical layer thickness of the insulating layer and the insulating layer thus serves as the only mechanically stabilizing layer of the respective component.

\* \* \* \* \*